(12) United States Patent
Bok et al.

(10) Patent No.: US 11,626,466 B2
(45) Date of Patent: Apr. 11, 2023

(54) DISPLAY DEVICE

(71) Applicant: Samsung Display Co., LTD., Yongin-si (KR)

(72) Inventors: Seung Lyong Bok, Yongin-si (KR); Sun Mi Yu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 231 days.

(21) Appl. No.: 17/029,873

(22) Filed: Sep. 23, 2020

(65) Prior Publication Data

US 2021/0296420 A1 Sep. 23, 2021

(30) Foreign Application Priority Data

Mar. 17, 2020 (KR) .......................... 10-2020-0032738

(51) Int. Cl.
*H01L 27/32* (2006.01)
*H04N 5/225* (2006.01)

(52) U.S. Cl.
CPC ...... *H01L 27/3276* (2013.01); *H01L 27/3223* (2013.01); *H04N 5/2257* (2013.01)

(58) Field of Classification Search
CPC ............ H01L 27/3276; H01L 27/3223; H04N 5/2257
See application file for complete search history.

(56) References Cited

U.S. PATENT DOCUMENTS

| | | | |
|---|---|---|---|
| 10,192,938 B2 | 1/2019 | Yu et al. | |
| 2018/0129106 A1* | 5/2018 | Gao | G09G 3/3648 |
| 2018/0158417 A1* | 6/2018 | Xiang | G09G 3/3258 |
| 2018/0164850 A1 | 6/2018 | Sim et al. | |
| 2018/0190190 A1* | 7/2018 | Xi | G09G 3/3208 |
| 2019/0319212 A1 | 10/2019 | Park et al. | |
| 2021/0193746 A1* | 6/2021 | Lee | G09G 3/3266 |
| 2021/0351261 A1* | 11/2021 | Kim | H01L 27/3276 |

FOREIGN PATENT DOCUMENTS

| | | |
|---|---|---|
| KR | 10-2018-0065722 | 6/2018 |
| KR | 10-2019-0119960 | 10/2019 |
| KR | 10-2019-0121690 | 10/2019 |

* cited by examiner

*Primary Examiner* — David Vu
*Assistant Examiner* — Brandon C Fox
(74) *Attorney, Agent, or Firm* — Kile Park Reed & Houtteman PLLC

(57) ABSTRACT

A display device includes a display panel including a substrate including a front display region, a side display region extending from a side of the front display region, and a transmission region including at least a portion overlapping the front display region in a plan view; and a sensor located on a bottom of the substrate, the sensor having at least a portion overlapping the transmission region in a plan view. The display panel includes first pixels in the front display region; a load compensation element in the side display region; and a connection line electrically connecting the first pixels and the load compensation element by detouring the transmission region.

20 Claims, 21 Drawing Sheets

DISPLAY DEVICE

CROSS-REFERENCE TO RELATED APPLICATION(S)

This application claims priority to and benefits of Korean patent application 10-2020-0032738 under 35 U.S.C. § 119, filed on Mar. 17, 2020 in the Korean Intellectual Property Office, the entire contents of which are incorporated herein by reference.

BACKGROUND

1. Technical Field

The disclosure generally relates to a display device.

2. Description of the Related Art

The importance of display devices has increased with the development of multimedia. Accordingly, various kinds of display devices such as a Liquid Crystal Display (LCD) and an Organic Light Emitting Display (OLED) have been used.

Among these display devices, the OLED may display an image by using an organic light emitting diode in which light may be generated by a recombination of electrons and holes. The OLED has advantages of high response speed, high luminance, a wide viewing angle, and may be driven at a low power consumption.

Meanwhile, while a general display device may display an image at only a front portion, a display device which may display an image even at a side portion has recently been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of minimizing a luminance difference in a front display region, even in a case that a transmission region for a sensor device may be formed or disposed in the front display region.

In accordance with an aspect of the disclosure, there is provided a display device that may include a display panel that may include a substrate that may include a front display region; a side display region extending from a side of the front display region; and a transmission region including at least a portion overlapping the front display region in a plan view; and a sensor located on a bottom of the substrate, the sensor having at least a portion overlapping the transmission region in a plan view, wherein the display panel may include first pixels disposed in the front display region; a load compensation element disposed in the side display region; and a connection line electrically connecting the first pixels and the load compensation element by detouring the transmission region.

The front display region may include a first region, a second region, and a third region, the first region, the second region, and the third region may have different areas. The connection line may electrically connect first pixels disposed in the second region and first pixels disposed in the third region by detouring the transmission region.

An area of the first region may be greater than an area of the second region and an area of the third region.

The load compensation element may compensate for a difference between a load value of the second region and the third region and a load value of the first region.

The first pixels of the second region, that may be electrically connected to a side of the connection line, and the first pixels of the third region, that may be electrically connected to the another side of the connection line, may be disposed on a same pixel row.

The load compensation element may include a first conductive layer, a semiconductor layer, and a second conductive layer, that may be stacked. The first conductive layer and the second conductive layer may be electrically connected to each other to form a first capacitor electrode of the load compensation element, and the semiconductor layer may form a second capacitor electrode of the load compensation element.

The connection line may be formed of a same conductive layer as the first conductive layer.

The load compensation element may be a dummy pixel that may not emit light.

The display panel may include: a substrate; a circuit element layer disposed on the substrate, the circuit element layer may include transistors; a first electrode electrically connected to the transistors; a second electrode disposed on the first electrode; and a light emitting layer disposed between the first electrode and the second electrode. At least one of the first electrode, the second electrode, and the light emitting layer may not overlap the dummy pixel.

The connection line may include bent parts.

The display panel may include second pixels disposed in the transmission region.

A number of the first pixels per unit area may be greater than a number of second pixels per unit area.

The transmission region may include a transmission part not overlapping the second pixels, and the sensor may overlap the transmission part.

The second pixels may be adjacent to the transmission part.

The sensor may be a camera, and may receive light from the transmission part while overlapping the transmission part.

The display device may include a reflective member that may reflect light from the transmission part and may transfer the reflected light to the sensor.

The display panel may include a first signal line electrically connected to the first pixels disposed on a same pixel row or a same pixel column by detouring the transmission part.

The first signal line and the connection line may be formed of different conductive layers.

The display panel may include a second signal line electrically connected to the second pixels by detouring the transmission part. The second signal line and the first signal line may be formed of different conductive lines.

The side display region may include: a first side display region extending from a first side of the front display region; and a second side display region extending from a second side of the front display region. The display panel may include a corner region disposed between the first side display region and the second side display region.

BRIEF DESCRIPTION OF THE DRAWINGS

Example embodiments will now be described more fully hereinafter with reference to the accompanying drawings.

however, they may be embodied in different forms and should not be construed as limited to the embodiments set forth herein. Rather, these embodiments are provided so that this disclosure will be thorough and complete, and will fully convey the scope of the disclosure to those skilled in the art.

DETAILED DESCRIPTION OF THE EMBODIMENTS

Figure 1:
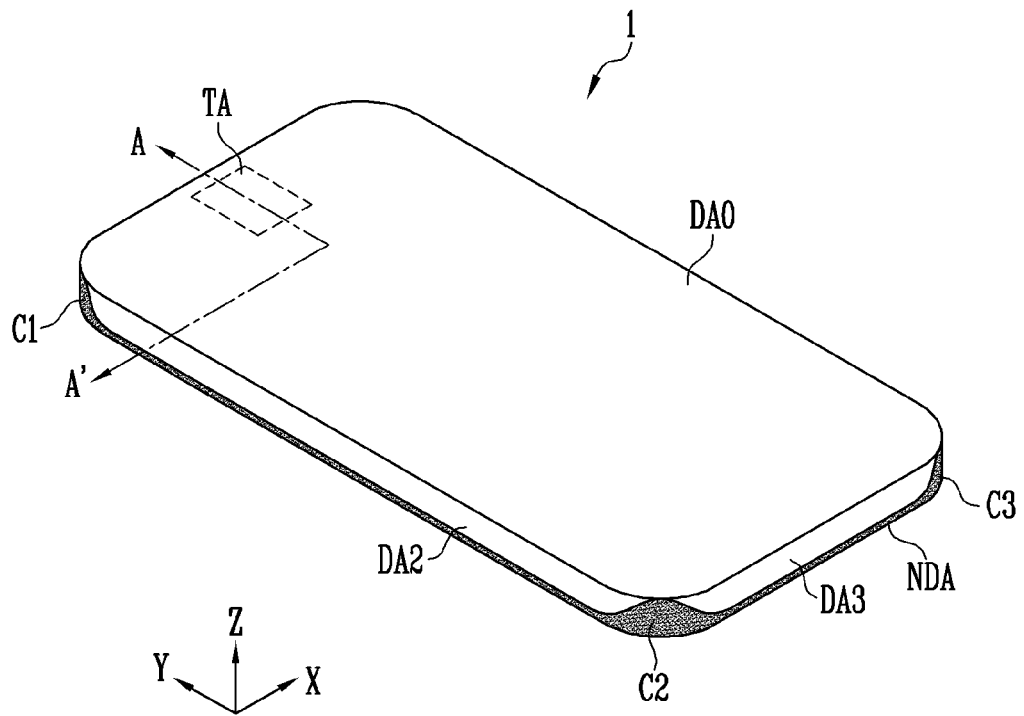
FIG. 1 is a perspective view of a display device in accordance with an embodiment.

The effects and characteristics of the disclosure and a method of achieving the effects and characteristics will be clear by referring to the embodiments described below in detail together with the accompanying drawings. However, the disclosure is not limited to the embodiments disclosed herein but may be implemented in various forms. For example, the disclosure may be defined by the scope of the appended claims.

Hereinafter, embodiments will be explained in detail with reference to the accompanying drawings.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" or "module" denotes a structure or element as illustrated in the drawings and as described in the specification. However, the disclosure is not limited thereto. The term "unit" or "module" is not to be limited to that which is illustrated in the drawings Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings. In the entire description, the same drawing reference numerals are used for the same elements across various figures.

Figure 2:
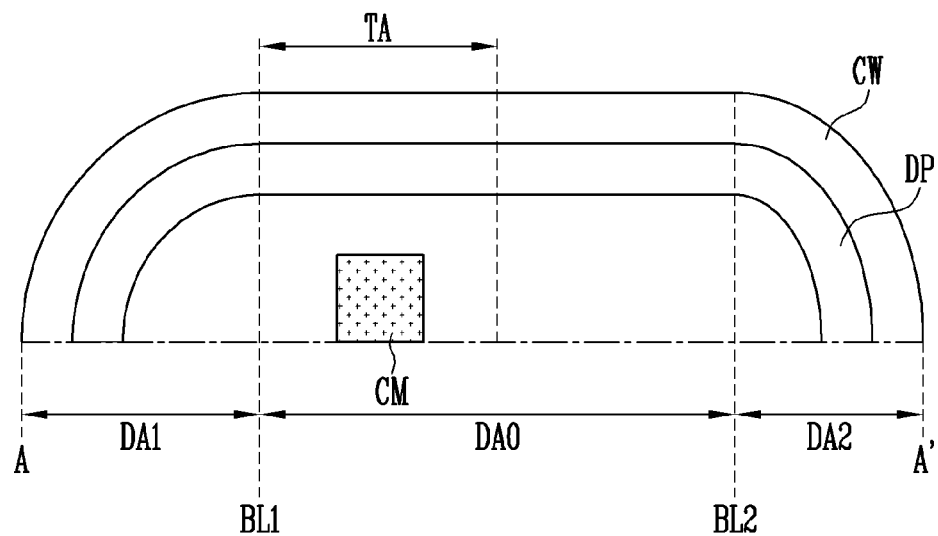
FIGS. 2 and 3 are schematic cross-sectional views taken along line A-A' shown in FIG. 1.
Figure 3:
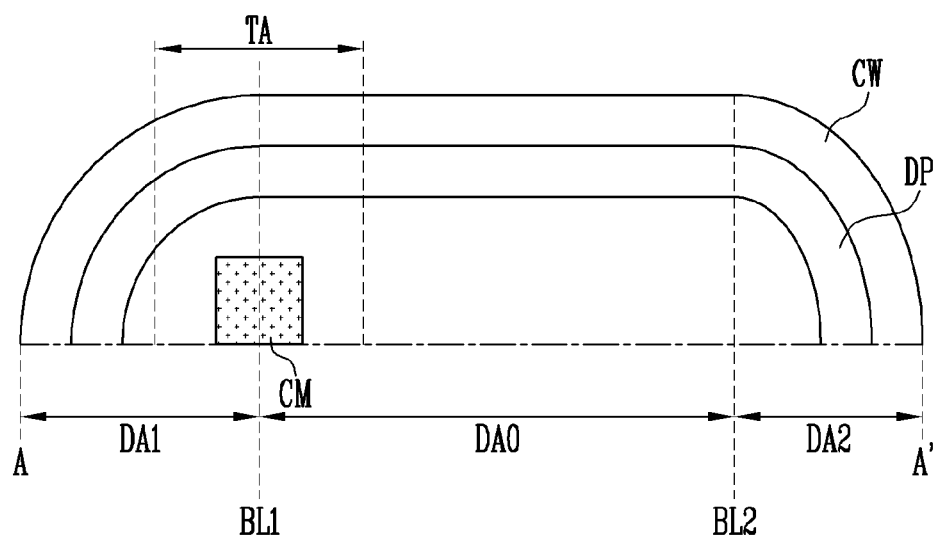
Figure 4:
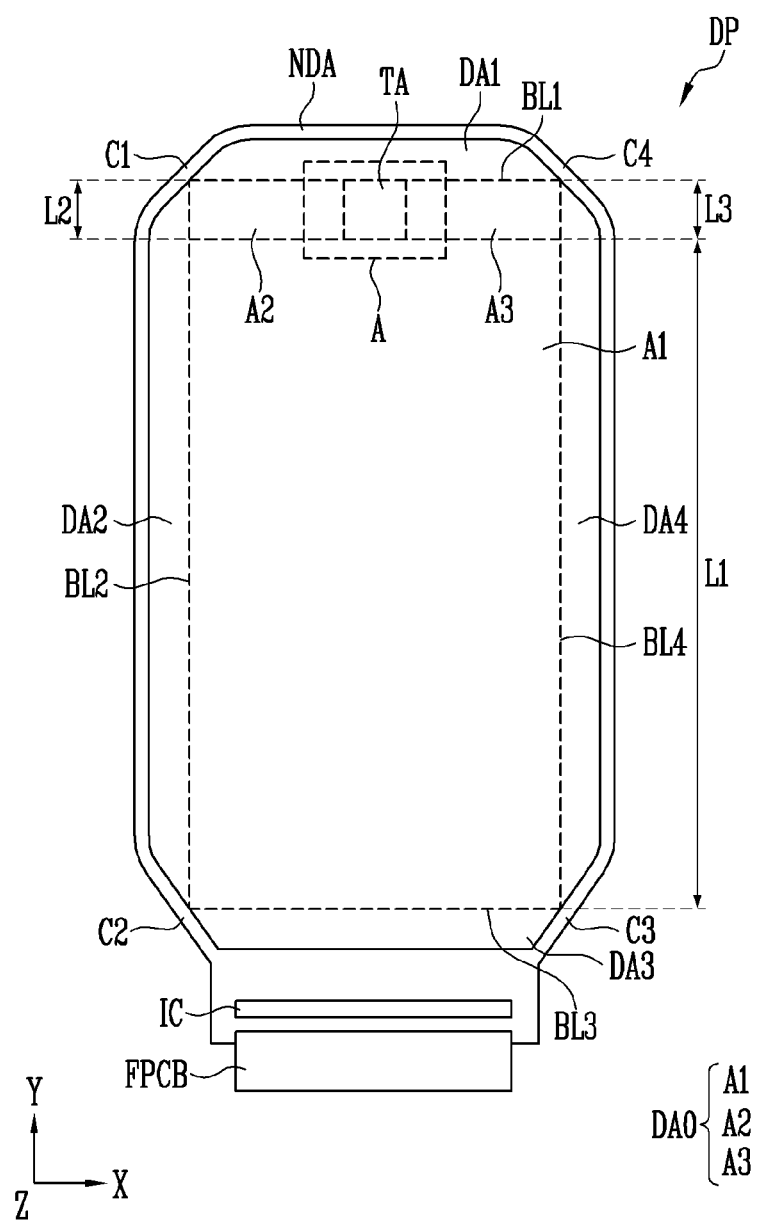
FIGS. 4 and 5 are development views of a display panel shown in FIG. 2.
Figure 5:
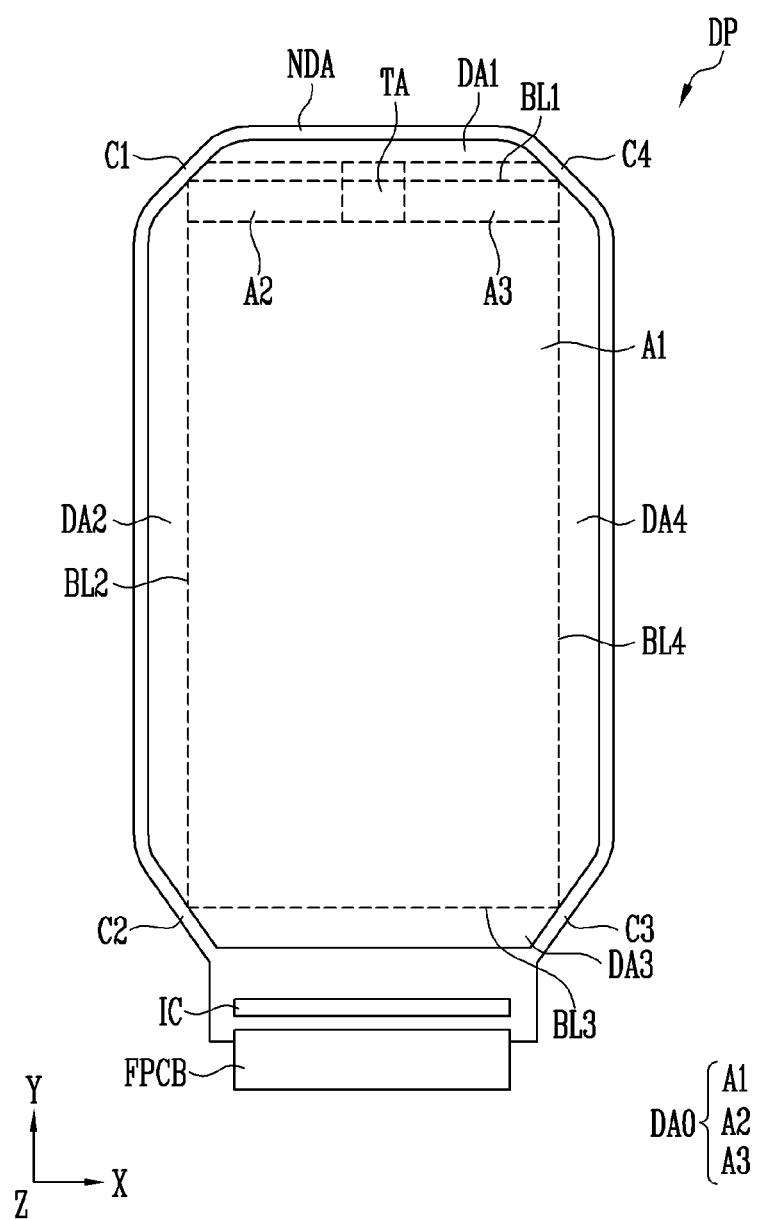

FIG. 1 is a perspective view of a display device in accordance with an embodiment. FIGS. 2 and 3 are schematic cross-sectional views taken along line A-A' shown in FIG. 1. FIGS. 4 and 5 are development views of a display panel shown in FIG. 2.

Referring to FIG. 1, the display device 1 is a device that may display a moving image or still image. The display device 1 may be used as a display screen for not only portable electronic devices such as a mobile phone, a smart phone, a tablet personal computer (PC), a smart watch, a watch phone, a mobile communication terminal, an electronic notebook, an electronic book, a portable multimedia player (PMP), a navigation system, and an ultra-mobile PC but also various products such as a television, a notebook computer, a monitor, an advertising board, and Internet of things (JOT).

Referring to FIGS. 2 and 3, the display device 1 may include a display panel DP, a cover window CW disposed on the top of the display panel DP, and a sensor device CM disposed under or below the display panel DP.

The display panel DP may be an organic light emitting display panel using an organic light emitting diode as a light emitting device, a micro light emitting diode display panel using a micro light emitting diode as a light emitting device, a quantum dot organic light emitting display panel using a quantum dot and an organic light emitting diode, or an inorganic light emitting display panel using an inorganic semiconductor as a light emitting device. Hereinafter, a case where the display panel DP is an organic light emitting display panel is mainly described. The display panel DP may include a transmission region TA which serves as a path of light advancing toward the sensor device CM from the outside of the display device 1. The transmission region TA may include a transmission part TP at which any pixel is not partially formed. The transmission part TP will be described in detail later with reference to FIG. 6.

The cover window CW may be disposed on the top of the display panel DP. The cover window CW may function to protect a top surface and side surfaces of the display panel DP. The cover window CW may be coupled to the display panel DP through an optically clear adhesive film (OCA) or an optically clear resin (OCR). The cover window CW may be made of glass, sapphire, and/or plastic. The cover window CW may be formed rigidly or flexibly.

The sensor device CM may be disposed under or below the display panel DP. The sensor device CM may be a camera device, and may include an image sensor which may receive light provided through the transmission part TP of the transmission region TA. However, the disclosure is not limited thereto, and the sensor device CM may include at least one of an illuminance sensor, an iris sensor, an infrared sensor, and/or an ultrasonic sensor. The sensor device CM may be disposed in the transmission region TA as shown in FIG. 2. In a case that the transmission region TA may be disposed in a front display region DA0 which will be described later, the sensor device CM may also be disposed in the front display region DA0. However, the disclosure is not limited thereto, and the sensor device CM and the transmission region TA may overlap a first side display region DA1 and/or a first bending line BL1, which will be described later, as shown in FIG. 3. The first side display region DA1 may serve as an auxiliary display region, in a case that the position and display quality (external light reflection) of the first side display region DA1 are considered. The first side display region DA1 may have little concern that a resolution of the first side display region DA1 will be lower than that of the front display region DA0 as a main display region. Thus, in a case that the sensor device CM and the transmission region TA are disposed to overlap the first side display region DA1 and/or the first bending line BL1, the lowering of the resolution of the front display region DA0 as the main display region may be minimized.

Referring to FIG. 4, one of the sides or a side of the display panel DP may be bent with respect to bending lines BL1, BL2, BL3, and BL4 to form substantially curved surfaces, or may be folded in the opposite direction of a third direction (Z-axis direction).

The display panel DP may include the front display region DA0 formed flat and side display regions DA1, DA2, DA3, and DA4 bent or folded with respect to the bending lines BL1, BL2, BL3, and BL4. The front display region DA0 and the side display regions DA1, DA2, DA3, and DA4 may correspond to a display region in which pixels may be disposed to display an image.

The front display region DA0 may have a substantially rectangular planar shape surrounded by or adjacent to the first bending line BL1 and a third bending line BL3, which extend in a first direction (X-axis direction), and a second bending line BL2 and a fourth bending line BL4, which extend in a second direction (Y-axis direction). Corners at which the bending lines BL1, BL2, BL3, and BL4 meet each other may be formed substantially round to have a predetermined curvature.

The above-described transmission region TA may at least partially overlap the front display region DA0. The transmission region TA overlaps with the sensor device CM, to serve as a path of light advancing toward the sensing device CM from the outside of the display device 1. According to a number of sensor devices CM, the transmission region TA may include transmission regions TA respectively corresponding to the sensor devices CM, or may have a linear shape corresponding to sensor devices CM, but the disclosure is not limited thereto.

The transmission region TA may be disposed adjacent to the first bending line BL1 (or the first side display region DA1). However, the disclosure is not limited thereto, and the transmission region TA may be disposed adjacent to the second bending line BL2 (or a second side display region DA2) or the fourth bending line BL4 (or a fourth side display region DA4).

The front display region DA0 may include a first region A1, a second region A2, and a third region A3, which may have different areas. An area of the first region A1 may be greater than that of the second region A2 and/or the third region A3. A width L1 of the first region A1 in the second direction (Y-axis direction) may be greater than that L2 of the second region A2 in the second direction (Y-axis direction) and/or that L3 of the third region A3 in the second direction (Y-axis direction). The second region A2 and the third region A3 may be spaced apart from each other in the first direction (X-axis direction) with the above-described transmission region TA interposed therebetween.

The side display regions DA1, DA2, DA3, and DA4 may include the first side display region DA1, the second side display region DA2, a third side display region DA3, and the fourth side display region DA4. The first to fourth side display regions DA1, DA2, DA3, and DA4 may be regions which extend from first to fourth sides of the front display region DA0 and are bent or folded with the first to fourth bending lines BL1, BL2, BL3, and BL4, respectively. The first side display region DA1 may be a region relatively adjacent to the sensor device CM. In order to secure a space in which the sensor device CM is disposed, a radius of curvature of the first side display region DA1 may be formed greater than those of the second to fourth side display regions DA2, DA3, and DA4.

A non-display region NDA may be located or disposed at edges of the front display region DA0 and the side display regions DA1, DA2, DA3, and DA4.

The non-display region NDA may include corner regions C1, C2, C3, and C4 located or disposed between the side display regions DA1, DA2, DA3, and DA4. The corner regions C1, C2, C3, and C4 may provide spaces through which lines pass. The corner regions C1, C2, C3, and C4 may include first to fourth corner regions C1, C2, C3, and C4 respectively located or disposed between the first to fourth side display regions DA1, DA2, DA3, and DA4. The first to fourth corner regions C1, C2, C3, and C4 may be respectively disposed adjacent to four corners at which the bending lines BL1, BL2, BL3, and BL4 meet each other. In an embodiment, the corner regions C1, C2, C3, and C4 may be omitted.

A driving chip IC may be disposed on the non-display region NDA extending from the edge of the third side display region DA3. The driving chip IC may generate a driving signal necessary that may drive the pixels and may provide the driving signal to pixels disposed in the front display region DA0 and/or the side display regions DA1, DA2, DA3, and DA4. The driving chip IC may be attached onto the display panel DP through an anisotropic conductive film, or be attached onto the display panel DP through ultrasonic bonding. A driving board FPCB may be electrically connected to an end portion of the non-display region NDA of the display panel DP. A pad part may be provided or disposed at the end portion of the non-display region NDA of the display panel DP, and the driving board FPCB may be electrically connected onto the pad part. The driving board FPCB may be a flexible printed circuit board or a film.

Figure 6:
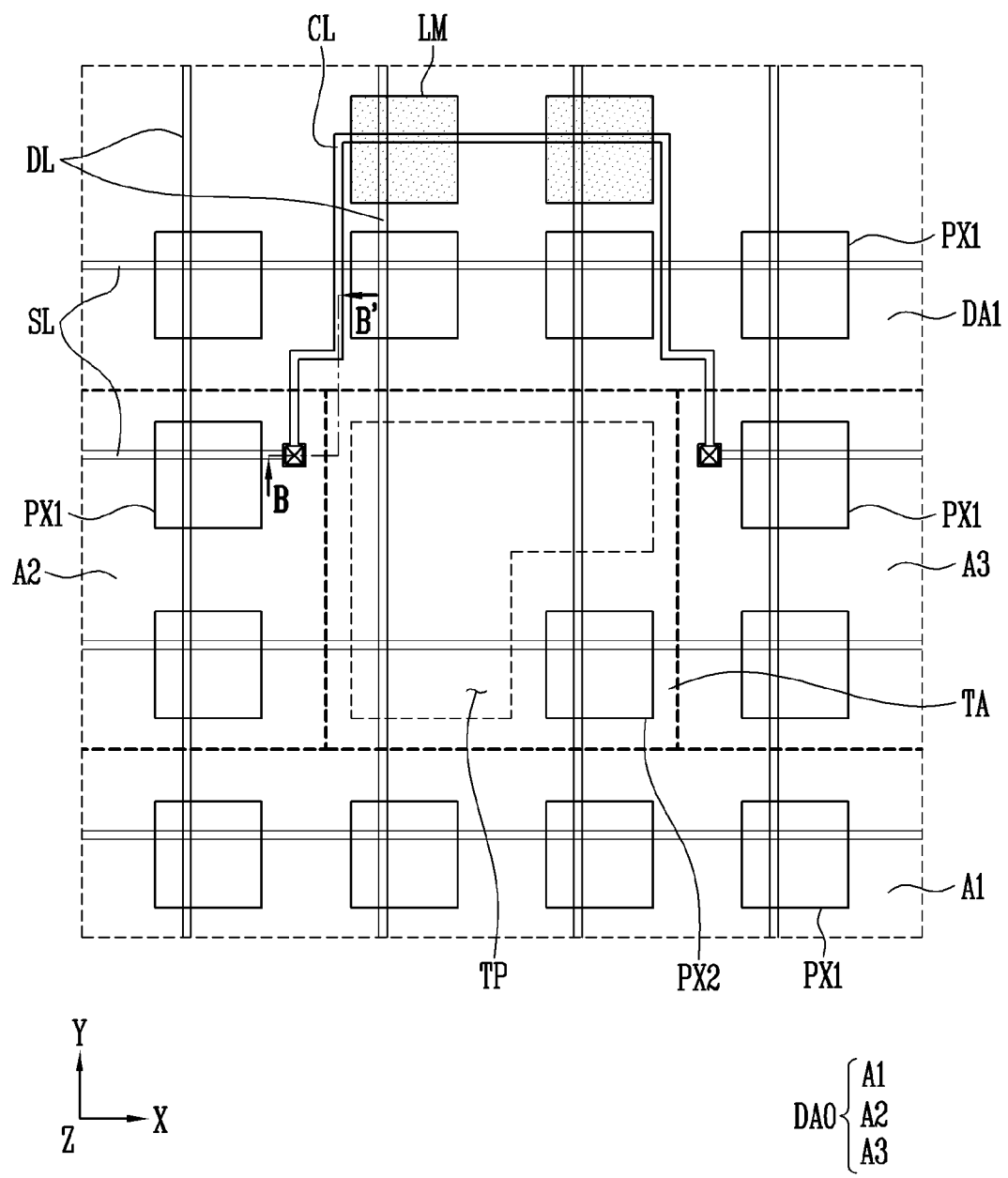
FIG. 6 is an enlarged view of region A shown in FIG. 4.
Figure 7:
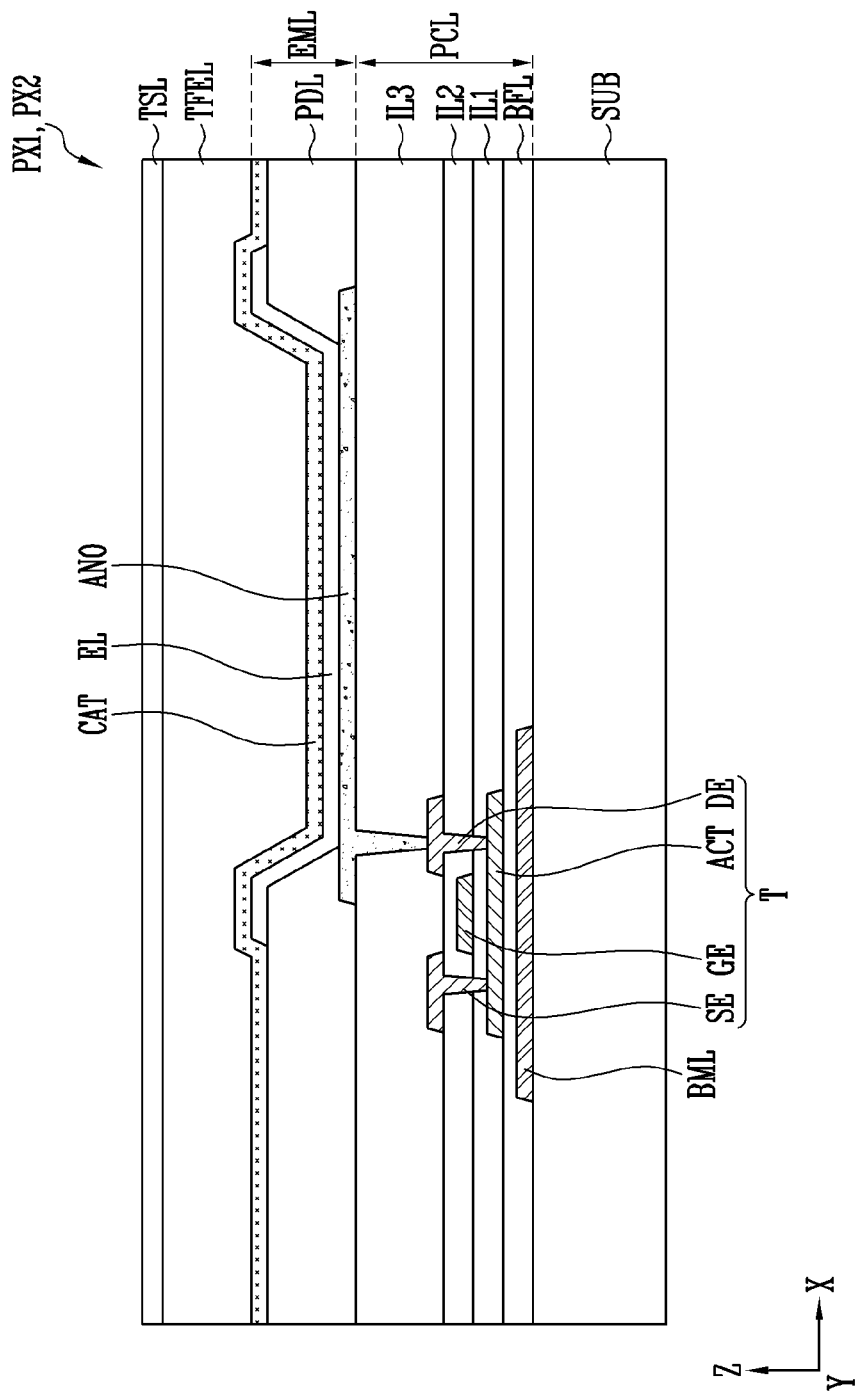
FIG. 7 is a schematic cross-sectional view of a pixel of the display device in accordance with an embodiment.
Figure 8:
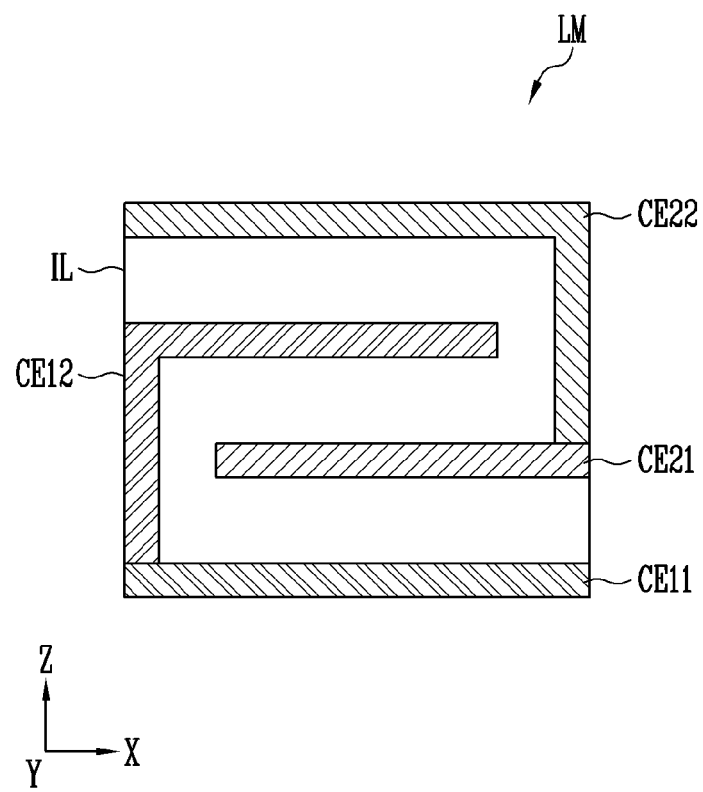
FIGS. 8 and 9 are schematic cross-sectional views illustrating a load compensation element in various embodiments.
Figure 9:
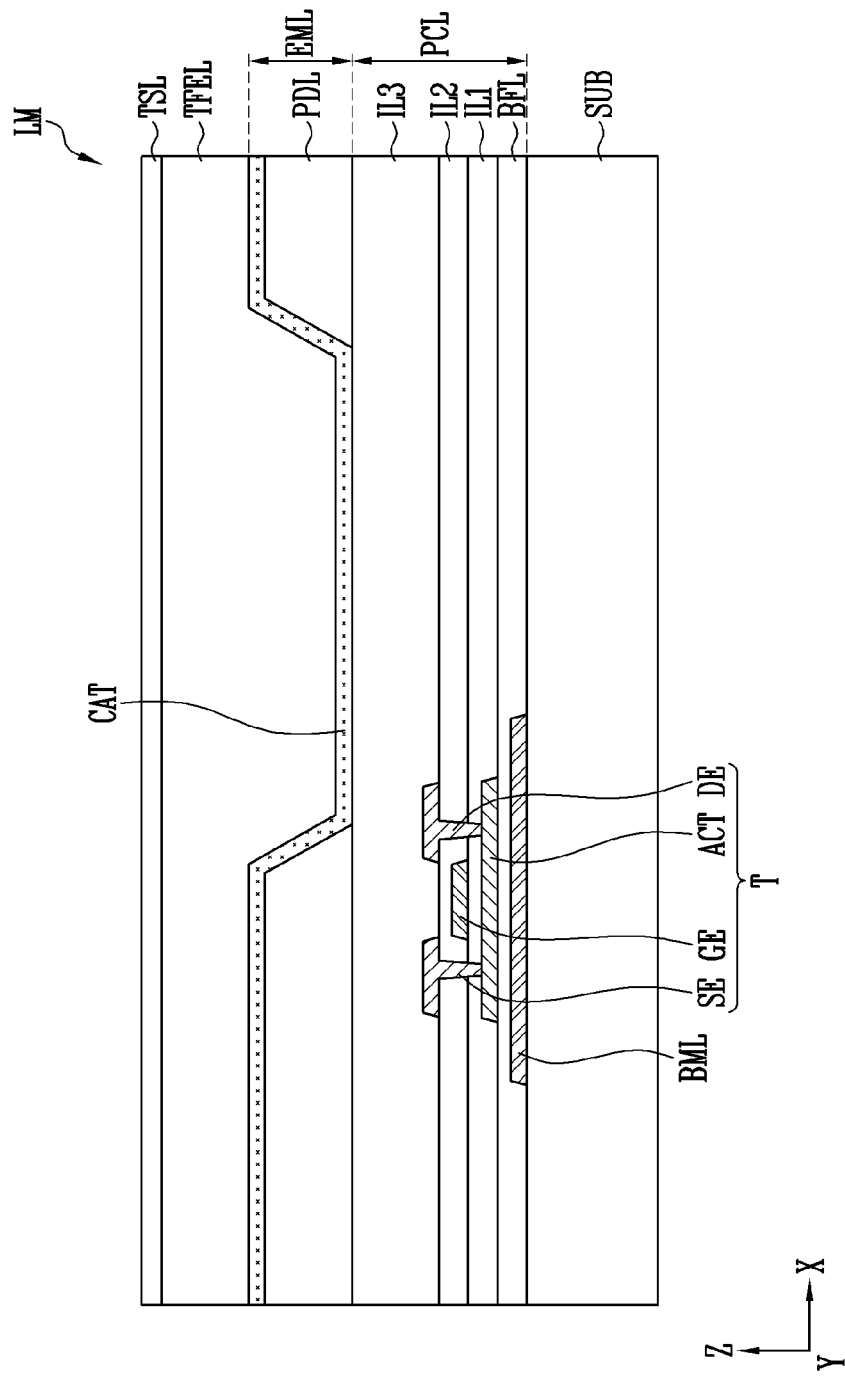
Figure 10:
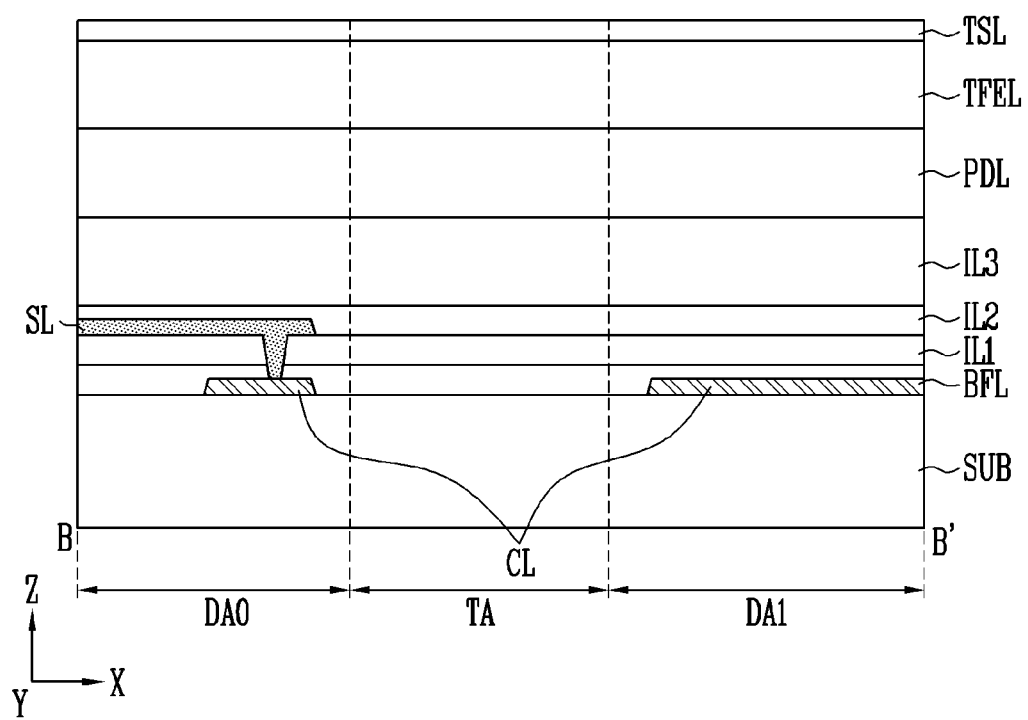
FIG. 10 is a schematic cross-sectional view taken along line B-B' shown in FIG. 6.

FIG. 6 is an enlarged view of region A shown in FIG. 4. FIG. 7 is a schematic cross-sectional view of a pixel of the display device in accordance with an embodiment. FIGS. 8 and 9 are schematic cross-sectional views illustrating a load compensation element in various embodiments. FIG. 10 is a schematic cross-sectional view taken along line B-B' shown in FIG. 6.

Referring to FIG. 6, the display panel DP may include pixels PX1 and PX2 disposed in the display regions DA0, DA1, DA2, DA3, and DA4 and/or the transmission region TA, signal lines SL and DL that may apply a signal to the pixels PX1 and PX2, a load compensation element LM, a connection line CL electrically connected to the load compensation element LM, and the like within the spirit and the scope of the disclosure.

As an example, the pixels PX1 and PX2 may include first pixels PX1 disposed in the front display region DA0 and the side display regions DA1, DA2, DA3, and DA4 and second pixels PX2 disposed in the transmission region TA. Each of the pixels PX1 and PX2 may include a group of sub-pixels capable of expressing a grayscale. For example, each of the pixels PX1 and PX2 may include a first sub-pixel emitting light of a first color (for example, red), a second sub-pixel emitting light of a second color (for example, green), and/or a third sub-pixel emitting light of a third color (for example, blue), but the disclosure is not limited thereto.

The pixels PX1 and PX2 may receive a signal provided from a driver through the signal lines SL and DL. The signal lines SL and DL may include scan lines SL electrically connected to the pixels PX1 and PX2 to provide a scan signal and data lines DL electrically connected to the pixels PX1 and PX2 to provide a data signal. The scan lines SL may extend along the first direction (X-axis direction), and be sequentially arranged or disposed at a predetermined distance along the second direction (Y-axis direction). The data lines DL may extend along the second direction (Y-axis direction) intersecting the first direction (X-axis direction), and may be sequentially arranged or disposed at a predetermined distance along the first direction (X-axis direction).

For convenience of description, only one data line DL and one scan line SL, which may be electrically connected to each of the pixels PX1 and PX2, are illustrated in FIG. 6. However, in a case that the first sub-pixel, the second sub-pixel, and the third sub-pixel may be electrically connected to the same scan line SL, the first sub-pixel, the second sub-pixel, and the third sub-pixel may be electrically connected to three different data lines DL. Hereinafter, there is assumed a case where the data line DL may be electrically connected to the first sub-pixel, and the other two data lines (not shown) may respectively be electrically connected to the second sub-pixel and the third sub-pixel. Hereinafter, the other two data lines (not shown) may have a shape substantially identical to that of the data line DL, and therefore, overlapping descriptions will be omitted.

Referring to FIG. 7, the display panel DP may include a circuit element layer PCL, a light emitting device layer EML, a thin film encapsulation layer TFEL, and a sensing layer TSL, which are disposed on a substrate.

The substrate SUB may be made of an insulating material such as glass, quartz or resin. Examples of the polymer material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. Alternatively, the substrate SUB may include a metallic material.

The circuit element layer PCL may be disposed on the substrate SUB. The circuit element layer PCL may include transistors T disposed on the substrate SUB and insulating layers BFL, IL1, IL2, and IL3 disposed between conductive layers constituting the transistors T.

A lower metal pattern BML is disposed on the substrate SUB. The lower metal pattern BML may function to block external light from being incident into a semiconductor layer ACT which will be described later. A barrier layer may be disposed between the substrate SUB and the lower metal pattern BML. The lower metal pattern BML may be formed in a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

A buffer layer BFL may be disposed over the lower metal pattern BML. The buffer layer BFL may be disposed on the entire surface of the substrate SUB. The buffer layer BFL may be configured or formed with inorganic layers which may be alternately stacked. For example, the buffer layer BFL may include at least one of a silicon oxide layer, a silicon nitride layer, and a silicon oxynitride layer.

The semiconductor layer ACT may be disposed on the buffer layer BFL. The semiconductor layer ACT may form channels of the transistors T of the pixels PX1 and PX2. The semiconductor layer ACT may include polycrystalline silicon. The polycrystalline silicon may be formed by crystallizing amorphous silicon. In a case that an ion is doped in the semiconductor layer ACT, the ion-doped semiconductor layer ACT may have conductivity. Therefore, the semiconductor layer ACT may include not only channel regions of the transistors but also a source region and a drain region. The source region and the drain region may be electrically connected to each channel region at both sides of the channel region.

In an embodiment, the semiconductor layer ACT may include single crystalline silicon, low temperature polycrystalline silicon, amorphous silicon, or an oxide semiconductor. The oxide semiconductor may include, for example, a two component-based compound (ABx), a three component-based compound (ABxCy), or a four component-based compound (ABxCyDz), which may contain indium (In), zinc (Zn), gallium (Ga), tin (Sn), titanium (Ti), aluminum (Al), hafnium (Hf), zirconium (Zr), magnesium (Mg), for example, and may include indium tin zinc oxide (ITZO) or indium gallium zinc oxide (IGZO).

A first insulating layer IL1 may be disposed over the semiconductor layer ACT. The first insulating layer IL1 may be disposed on the entire surface of the substrate SUB. The first insulating layer IL1 may include the same or similar material as the above-described buffer layer BFL, or include at least one selected from the materials exemplified as the material constituting the buffer layer BFL.

A gate electrode GE may be disposed on the first insulating layer IL1. The gate electrode GE may include the same or similar material as the above-described lower metal pattern BML, or may include at least one selected from the materials exemplified as the material constituting the lower metal pattern BML. The above-described scan line SL may be configured or formed with the same conductive layer as the gate electrode GE.

A second insulating layer IL2 may be disposed over the gate electrode GE. The second insulating layer IL2 may be disposed on the entire surface of the substrate SUB. The second insulating layer IL2 may include the same or similar material as the above-described first insulating layer IL1, or may include at least one selected from the materials exemplified as the material constituting the first insulating layer IL1.

A source electrode SE and/or a drain electrode DE may be disposed on the second insulating layer IL2. The source electrode SE and/or the drain electrode DE may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The source electrode SE and/or the drain electrode DE may be a single layer or a multi-layer. For example, the source electrode SE and/or the drain electrode DE may be formed in a stacked structure of Ti/Al/Ti, Mo/Al/Mo, Mo/AlGe/Mo, Ti/Cu, or the like within the spirit and the scope of the disclosure. The above-described data line DL may be configured or formed with the same conductive layer as the source electrode SE and/or the drain electrode DE. The source electrode SE and/or the drain electrode DE may be electrically connected to the source region and the drain region of the semiconductor layer ACT through contact holes penetrating the first insulating layer IL1 and the second insulating layer IL2, respectively.

A third insulating layer IL3 may be disposed over the source electrode SE and the drain electrode DE. The third insulating layer IL3 may be a via layer. The third insulating layer IL3 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The light emitting device layer EML may be disposed on the circuit element layer PCL. The light emitting device layer EML may include a first electrode ANO, a pixel defining layer PDL, a light emitting layer EL, and a second electrode CAT, which are disposed on the circuit element layer PCL.

Each of the above-described layers may be provided or disposed in a single layer or may be provided or disposed in a stacked layer including layers. Another layer may be disposed between the above-described layers.

The first electrode ANO may be disposed on the third insulating layer IL3 of the circuit element layer PCL. The first electrode ANO may have a stacked layer structure in which a material layer having a high work function such as Indium Tin Oxide (ITO), Indium Zinc Oxide (IZO), Zinc Oxide (ZnO), or Indium Oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof are stacked. The first electrode ANO may be electrically connected to the drain electrode DE through a contact hole penetrating the third insulating layer IL3.

The pixel defining layer PDL may be disposed over the first electrode ANO. The pixel defining layer PDL may include an inorganic insulating material such as silicon oxide, silicon nitride, silicon oxynitride, hafnium oxide, aluminum oxide, titanium oxide, tantalum oxide, or zinc oxide, or an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB). The pixel defining layer PDL may include an opening exposing the first electrode ANO. The opening may define a light emitting region of each of the pixels PX1 and PX2.

The light emitting layer EL may be disposed in the opening of the pixel defining layer PDL. The light emitting layer EL may include an organic light emitting layer, hole injection/transport layers, and electron injection/transport layers.

The second electrode CAT may be disposed on the light emitting layer EL and the pixel defining layer PDL. The second electrode CAT may be disposed on the entire surface of the substrate SUB. The second electrode CAT may include a material layer having a low work function, such as Li, Ca, LiF/Ca, LiF/Al, Al, Mg, Ag, Pt, Pd, Ni, Au, Nd, Ir, Cr, BaF, Ba, or a compound or mixture thereof (for example, a mixture of Ag and Mg). The second electrode CAT may include a transparent metal oxide layer disposed on the material layer having the low work function.

The thin film encapsulation layer TFEL may be disposed on the light emitting device layer EML. The thin film encapsulation layer TFEL may function to prevent oxygen or moisture from penetrating into the light emitting device layer EML. To this end, the thin film encapsulation layer TFEL may include at least one inorganic layer. The inorganic layer may include silicon nitride, aluminum nitride, zirconium nitride, titanium nitride, hafnium nitride, tantalum nitride, silicon oxide, aluminum oxide, or titanium oxide. Also, the thin film encapsulation layer TFEL may include at least one organic layer to prevent particles from penetrating into the light emitting device layer EML. The organic layer may include epoxy, acrylate or urethane acrylate.

The sensing layer TSL may be disposed on the thin film encapsulation layer TFEL. In a case that the sensing layer TSL may be directly disposed on the thin film encapsulation layer TFEL, the thickness of the display device 1 may be decreased as compared with in a case that a separate sensing panel including the sensing layer TSL may be attached. The sensing layer TSL may include sensing electrodes that may sense a touch of a user and sensing lines that may electrically connect the sensing electrodes to sensing pads.

Referring back to FIG. 6, the transmission region TA may include a transmission part TP at which the second pixels PX2 may be partially omitted. Since the transmission part TP may not overlap the second pixels PX2, the transmission part TP may provide a path through which light provided from the outside advances toward the sensor device CM in the display device 1. To this end, the transmission part TP may be disposed to at least partially overlap the sensor device CM. The transmission part TP may at least partially overlap the above-described scan line SL and/or the above-described data line DL. The scan line SL and/or the data line DL may be made of a transparent conductive material so as to provide the path through the light provided from the outside advances toward the sensor device CM in the display device 1.

An area of the transmission part TP may be greater than that of the second pixels PX2. For example, as shown in FIG. 6, the area of the transmission part TP may be about three times of that of the second pixels PX2, but the disclosure is not limited thereto. Since the second pixels PX2 are disposed in a region except the transmission part TP, a number of second pixels PX2 per unit area may be smaller than that of first pixels PX1 per unit area. The second pixels PX2 may be surrounded by or adjacent to the transmission part TP.

Meanwhile, since the second pixels PX2 may be partially omitted at the transmission part TP of the transmission region TA, a pixel row on the same row as the transmission part TP among pixel rows of the display panel DP may be configured with pixels of which a number may be smaller than that of other pixel rows. A pixel row of the second region A2 and the third region A3, which are disposed at one side and the other side of the transmission region TA, may have pixels of which number is smaller than that of pixels of pixel row of the first region A1. The pixel row may mean pixels electrically connected to the same scan line SL. Since the pixel row of the second region A2 and the third pixel region A3 has pixels of which number is smaller than that of pixels of the pixel rows of the first region A1, a load value of each of the second region A2 and the third region A3 and a load value of the first region A1 may be different from each other. The difference between the load values may cause a luminance difference between the first to third regions A1, A2, and A3 in the front display region DA0. Accordingly, the display device 1 in accordance with the disclosure may include a load compensation element LM that may compensate for a difference between load values in the front display region DA0 as the main display region. The load compensation element LM increases a scan line load of the pixel row of the second region A2 and the third region A3, which have a relatively small number of pixels due to the transmission region TA, to compensate for a load value difference with the pixel rows of the first region A1. The load compensation element LM will be described in detail with reference to FIGS. 8 and 9.

Referring to FIG. 8, the load compensation element LM may be implemented with a capacitor.

The load compensation element LM implemented with the capacitor may include a first conductive layer CE11, a semiconductor pattern CE21, a second conductive layer CE12, and a third conductive layer CE22, which are sequentially stacked, and an insulating layer IL disposed between the above-described layers.

The first conductive layer CE11 may be configured or formed with the same conductive layer as the above-described lower metal pattern BML.

The semiconductor pattern CE21 may be disposed on the first conductive layer CE11. The semiconductor pattern CE21 may be provided or disposed in the same layer as the above-described semiconductor layer ACT.

The second conductive layer CE12 may be disposed on the semiconductor pattern CE21. The second conductive layer CE12 may be configured or formed with the same conductive layer as the above-described gate electrode GE. The second conductive layer CE12 may be electrically connected to the first conductive layer CE11 to constitute a first capacitor electrode of the load compensation element LM.

The third conductive layer CE22 may be disposed on the second conductive layer CE12. The third conductive layer CE22 may be configured or formed with the same conductive layer as the above-described source electrode SE and/or the above-described drain electrode DE. The third conductive layer CE22 may be electrically connected to the semiconductor pattern CE21 to constitute a second capacitor electrode of the load compensation element LM. The first capacitor electrode and the second capacitor electrode of the load compensation element LM may be electrically isolated from each other by the insulating layer IL. The insulating layer IL may include the same or similar material as the above-described first to third insulating layers IL1, IL2, and IL3, or include at least one selected from the materials exemplified as the material constituting the first to third insulating layers IL1, IL2, and IL3.

Meanwhile, the load compensation element LM shown in FIG. 8 is merely illustrative, and the disclosure is not limited thereto. For example, in the structure of the load compensation element LM shown in FIG. 8, another capacitor arrangement may be applied, such as a capacitor arrangement in which some or a predetermined number of the conductive layers may be omitted or a capacitor arrangement in which some or a predetermined number of conductive layers may be added.

Referring to FIG. 9, the load compensation element LM may be implemented with a dummy pixel which does not emit light.

In the load compensation element LM implemented with the dummy pixel, some or a predetermined number of the components of the pixels PX1 and PX2 may be omitted to prevent light emission. For example, in the load compensation element LM, some or a predetermined number of components of the light emitting device layer EML may be omitted. Although a case where the load compensation element LM may include the second electrode CAT, but the first electrode ANO and the light emitting layer EL of the pixels PX1 and PX2 may be omitted is exemplified in FIG. 9, the disclosure is not limited thereto. In an embodiment, the load compensation element LM may include all the components of the light emitting device layer EML, but some or a predetermined number of components of the circuit element layer PCL may be omitted.

Referring back to FIG. 6, the load compensation element LM may be electrically connected to the first pixels PX1 of the second region A2 and the third region A3. The load compensation element LM may be disposed on a row different from that of the first pixels PX1 of the second region A2 and the third region A3, which are electrically connected to the load compensation element LM. In an embodiment, the load compensation element LM may be disposed in the side display regions DA1, DA2, DA3, and DA4. The load compensation element LM may be disposed in the side display regions DA1, DA2, DA3, and DA4 adjacent to the transmission region TA. Hereinafter, the first side display region DA1 will be mainly described, including the side display regions DA1, DA2, DA3, and DA4 in which the load compensation element LM is disposed, but the disclosure is not limited thereto.

The load compensation element LM may be electrically connected to the first pixels PX1 of the second region A2 and the third region A3 by the connection line CL. One end of the connection line CL may be electrically connected to the scan line SL of the second region A2. The connection line CL may extend from the second region A2, and be electrically connected to the load compensation element LM of the first side display region DA1 by detouring the transmission region TA. The connection line CL may again extend from the first side display region DA1, and the other end of the connection line CL may be electrically connected to the scan line SL of the third region A3. For example, the load compensation element LM disposed in the first side display region DA1 may be electrically connected to the first pixels PX1 of the second region A2 and the third region A3 by the connection line CL. The first pixels PX1 of the second region A2, which may be electrically connected to one side of the connection line CL, and the first pixels PX1 of the third region A3, which may be electrically connected to the other side of the connection line CL, may be provided or disposed on the same pixel row.

Referring to FIG. 10, the connection line CL may be configured or formed with a conductive layer different from that of the scan line SL. For example, the connection line CL may be configured or formed with the same conductive layer as the above-described lower metal pattern BML. The scan line SL may be electrically connected to the connection line CL through a contact hole penetrating the buffer layer BFL and the first insulating layer IL1.

As described above, the display device 1 in accordance with an embodiment may include the load compensation element LM disposed in the side display regions DA1, DA2, DA3, and DA4, and the first pixels PX1 of the second region A2 and the third region A3 are electrically connected to the load compensation element LM by the connection line CL which detours the transmission region TA.

Accordingly, although the pixel rows of the second region A2 and the third region A3 have a relatively small number of pixels due to the transmission region TA, the scan line load of the second region A2 and the third region A3 may be increased by the load compensation element LM.

For example, the difference between the load value of each of the second region A2 and the third region A3 and the load value of the first region A1 may be minimized. Accordingly, the lowering of resolution of the front display region DA0 as the main display region may be prevented, and simultaneously, the luminance difference in the front display region DA0 due to the transmission region TA may be minimized.

Hereinafter, other embodiments will be described. Hereinafter, components identical to those of the above-described embodiment are designated as like reference numerals, and overlapping descriptions will be omitted or simplified.

Figure 11:
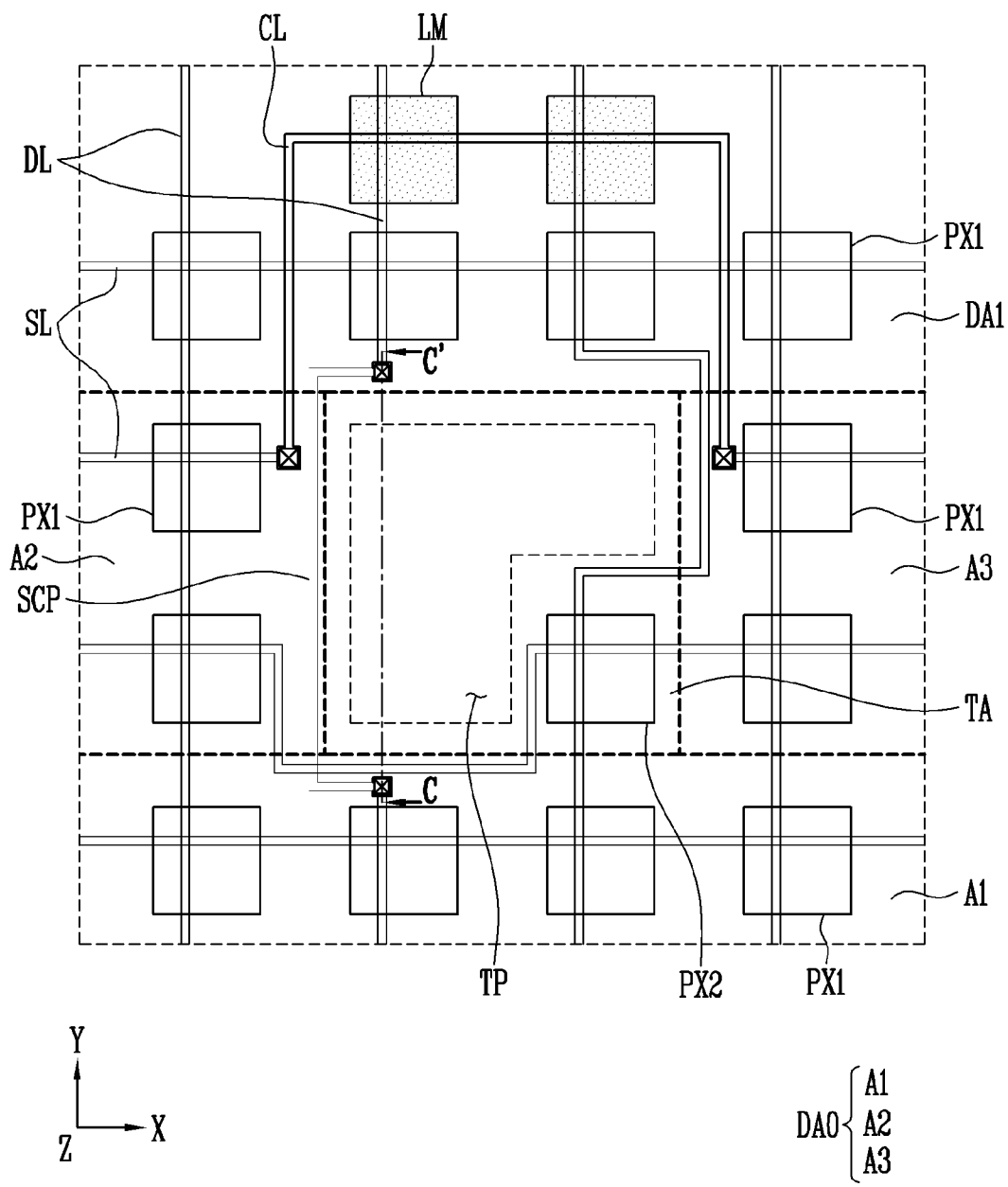
FIG. 11 is an enlarged view of a display device in accordance with an embodiment.
Figure 12:
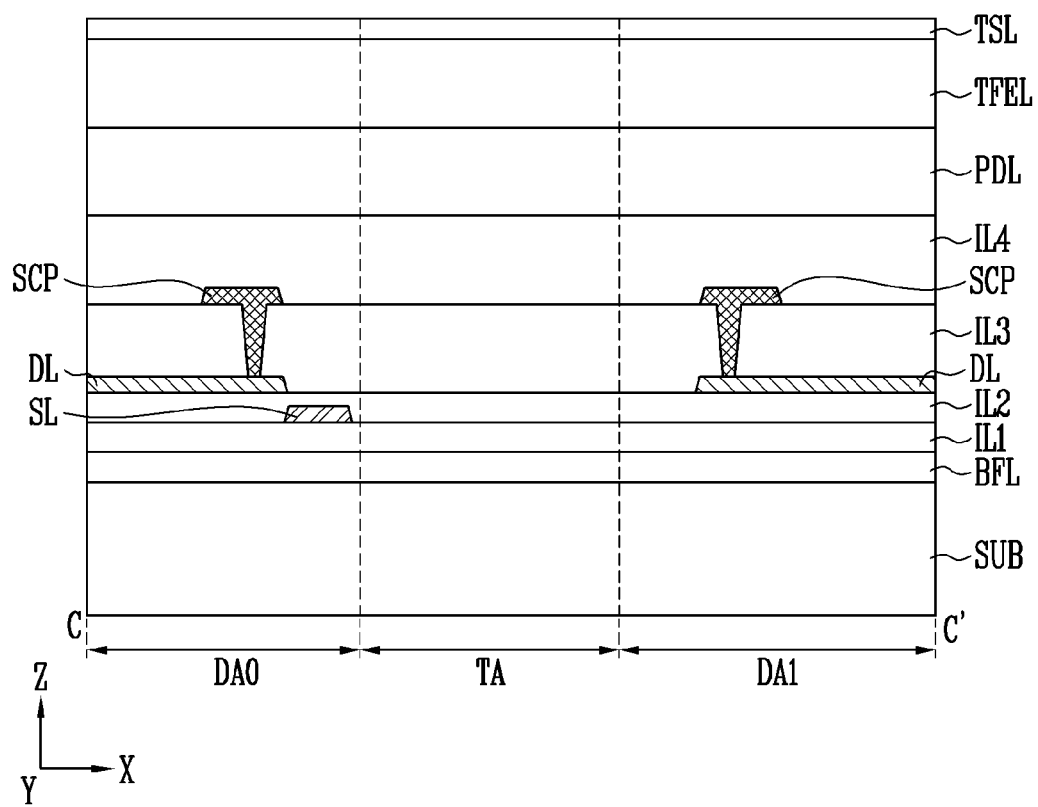
FIG. 12 is a schematic cross-sectional view taken along line C-C' shown in FIG. 11.
Figure 13:
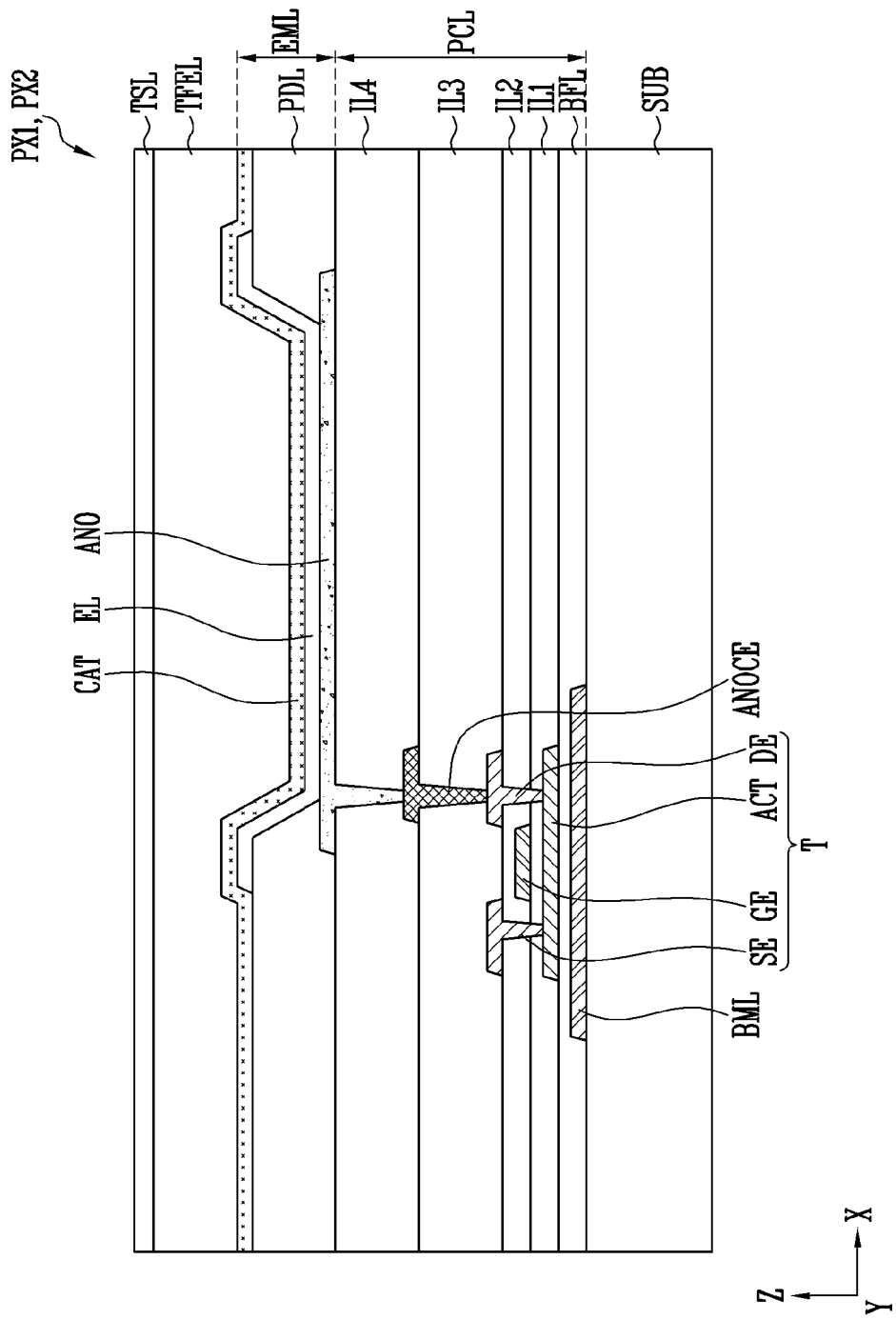
FIG. 13 is a schematic cross-sectional view illustrating a pixel shown in FIG. 11.

FIG. 11 is an enlarged view of a display device in accordance with an embodiment. FIG. 12 is a schematic cross-sectional view taken along line C-C' shown in FIG. 11. FIG. 13 is a schematic cross-sectional view illustrating a pixel shown in FIG. 11.

Referring to FIGS. 11 to 13, the display device in accordance with an embodiment may be different from an embodiment shown in FIGS. 1 to 10, in that the display device may include a signal connection pattern SCP, and the signal lines SL and DL and/or the signal connection pattern SCP may not overlap the transmission part TP.

The scan line SL may extend in the first direction (X-axis direction), and may be electrically connected to pixels PX1 and PX2 disposed on the same pixel row by detouring the transmission part TP. The data line DL may extend in the second direction (Y-axis direction), and may be electrically connected to pixels PX1 and PX2 disposed on the same column by detouring the transmission part TP. The same pixel row may mean pixels electrically connected to the same scan line SL, and the same pixel column may mean pixels electrically connected to the same data line DL.

In a case that the signal lines SL and DL may be electrically connected to the pixels PX1 and PX2 by detouring the transmission part TP, the transmittance of the transmission part TP may be improved, and unnecessary diffraction/reflection, for example, may be prevented.

In an embodiment, the signal line SL or DL may extend in one direction, and may be electrically connected to pixels PX1 and PX2 disposed on the same pixel row or the same pixel column by the signal connection pattern SCP which may detour the transmission part TP. For example, as shown in FIG. 11, one end and the other end of the signal connection pattern SCP may be electrically connected to the data line DL by detouring the transmission part TP, to be electrically connected to the pixels PX1 and PX2 disposed on the same pixel column. In a case that the signal lines SL and DL and/or the signal connection pattern SCP may be electrically connected to the pixels PX1 and PX2 by detouring the transmission part TP, the transmittance of the transmission part TP may be improved, which has been described above.

Meanwhile, although a case where the one end and the other end of the signal connection pattern SCP may be electrically connected to the data line DL has been mainly described in FIG. 11, the disclosure is not limited thereto. For example, the one end and the other end of the signal connection pattern SCP may be electrically connected to the scan line SL by detouring the transmission part TP, to be electrically connected to the pixels PX1 and PX2 disposed on the same pixel row.

Referring to FIG. 12, the signal lines SL and DL and/or the signal connection pattern SCP may be configured or formed with different conductive layers. For example, the scan line SL may be disposed between the first insulating layer IL1 and the second insulating layer IL2, the data line DL may be disposed between the second insulating layer IL2 and the third insulating layer IL3, and the signal connection pattern SCP may be disposed on the third insulating layer IL3. The signal connection pattern SCP may include the same or similar material as the above-described source electrode SE and/or the above-described drain electrode DE, or include at least one material selected from the materials exemplified as the material constituting the source electrode SE and/or the drain electrode DE.

A fourth insulating layer IL4 may be disposed over the signal connection pattern SCP. The fourth insulating layer IL4 may be a via layer. The fourth insulating layer IL4 may include the same or similar material as the above-described insulating layer IL3, or include at least one material selected from the materials exemplified as the material constituting the third insulating layer IL3. In a case that the signal lines SL and DL and the signal connection pattern SCP are configured or formed with different conductive layers, the lines may be prevented from being short-circuited even in a case that a distance between the lines may be formed narrow since the signal lines SL and DL and/or the signal connection pattern SCP detour the transmission part TP.

Referring to FIG. 13, the circuit element layer PCL may include a connection electrode ANOCE disposed between the transistors T and the first electrode ANO.

The connection electrode ANOCE may be electrically connected to the drain electrode DE of each of the transistors T through a contact hole penetrating the third insulating layer IL3. The connection electrode ANOCE may be configured or formed with the same conductive layer as the above-described signal connection pattern SCP.

The fourth insulating layer IL4 may be disposed over the connection electrode ANOCE, and the first electrode ANO of each of the pixels PX1 and PX2 may be disposed on the fourth insulating layer IL4. The first electrode ANO may be electrically connected to the connection electrode ANOCE through a contact hole penetrating the fourth insulating layer IL4.

In accordance with an embodiment, the signal connection pattern SCP and/or the signal lines SL and DL may be electrically connected to the pixels PX1 and PX2 by detouring the transmission part TP, so that the transmittance of the transmission part TP may be improved, and unnecessary diffraction/reflection, for example, may be prevented.

The scan line load of the second region A2 and the third region A3 may be increased by the load compensation element LM disposed in the side display regions DA1, DA2, DA3, and DA4, and thus the difference between the load value of each of the second region A2 and the third region A3 and the load value of the first region A1 may be minimized. Accordingly, the lowering of resolution of the front display region DA0 as the main display region may be prevented, and simultaneously, the luminance difference in the front display region DA0 due to the transmission region TA may be minimized, which has been described above.

Figure 14:
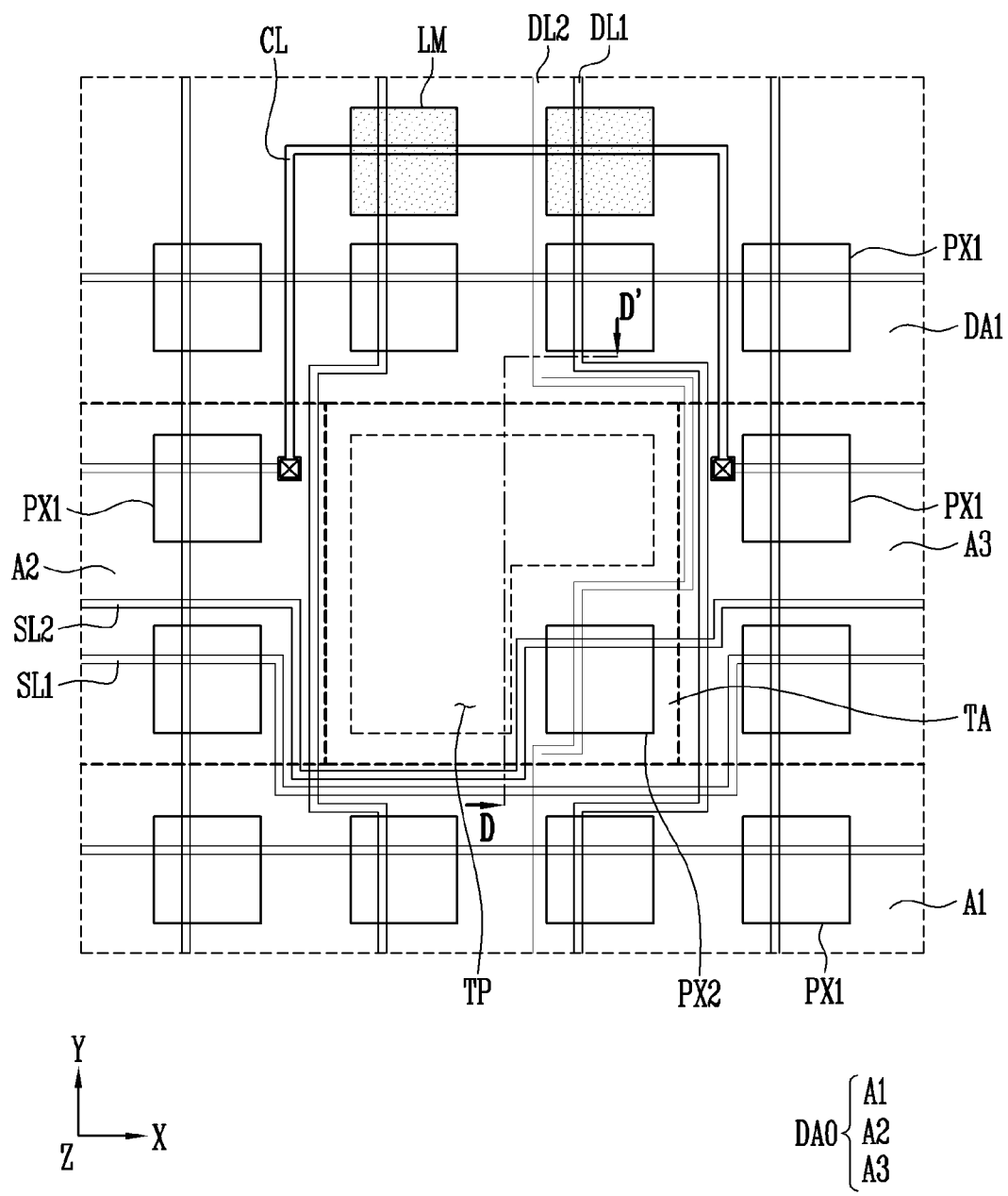
FIG. 14 is an enlarged view of a display device in accordance with an embodiment.
Figure 15:
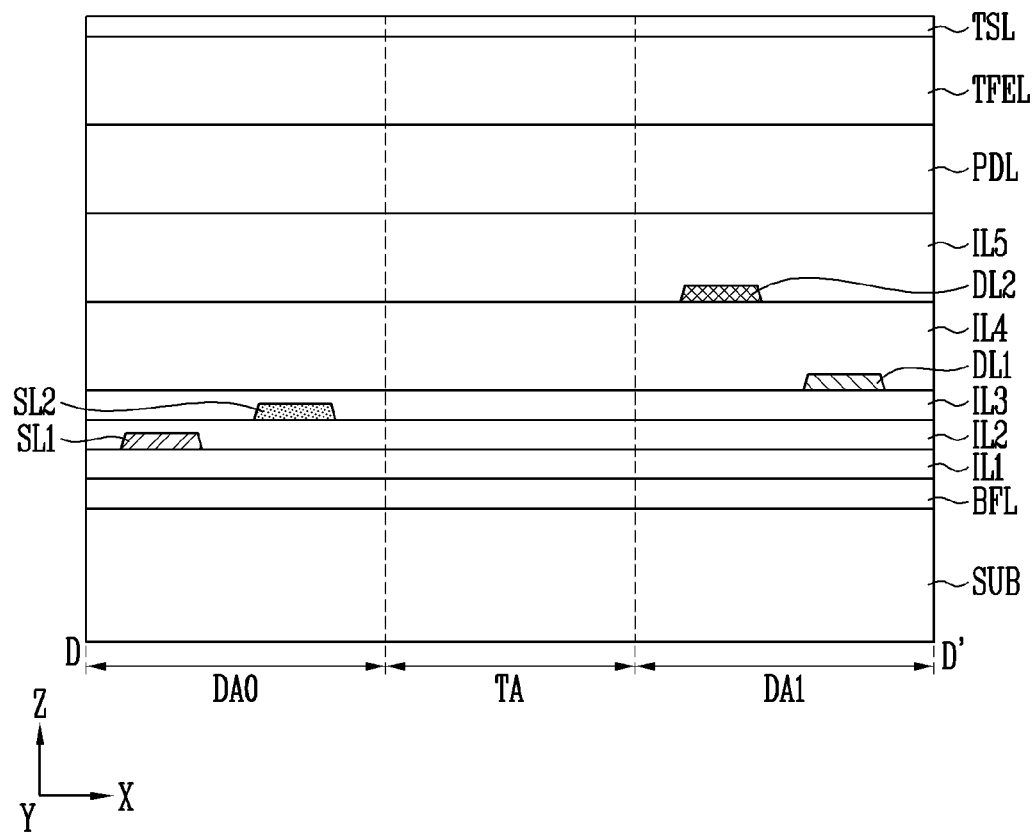
FIG. 15 is a schematic cross-sectional view taken along line D-D' shown in FIG. 14.
Figure 16:
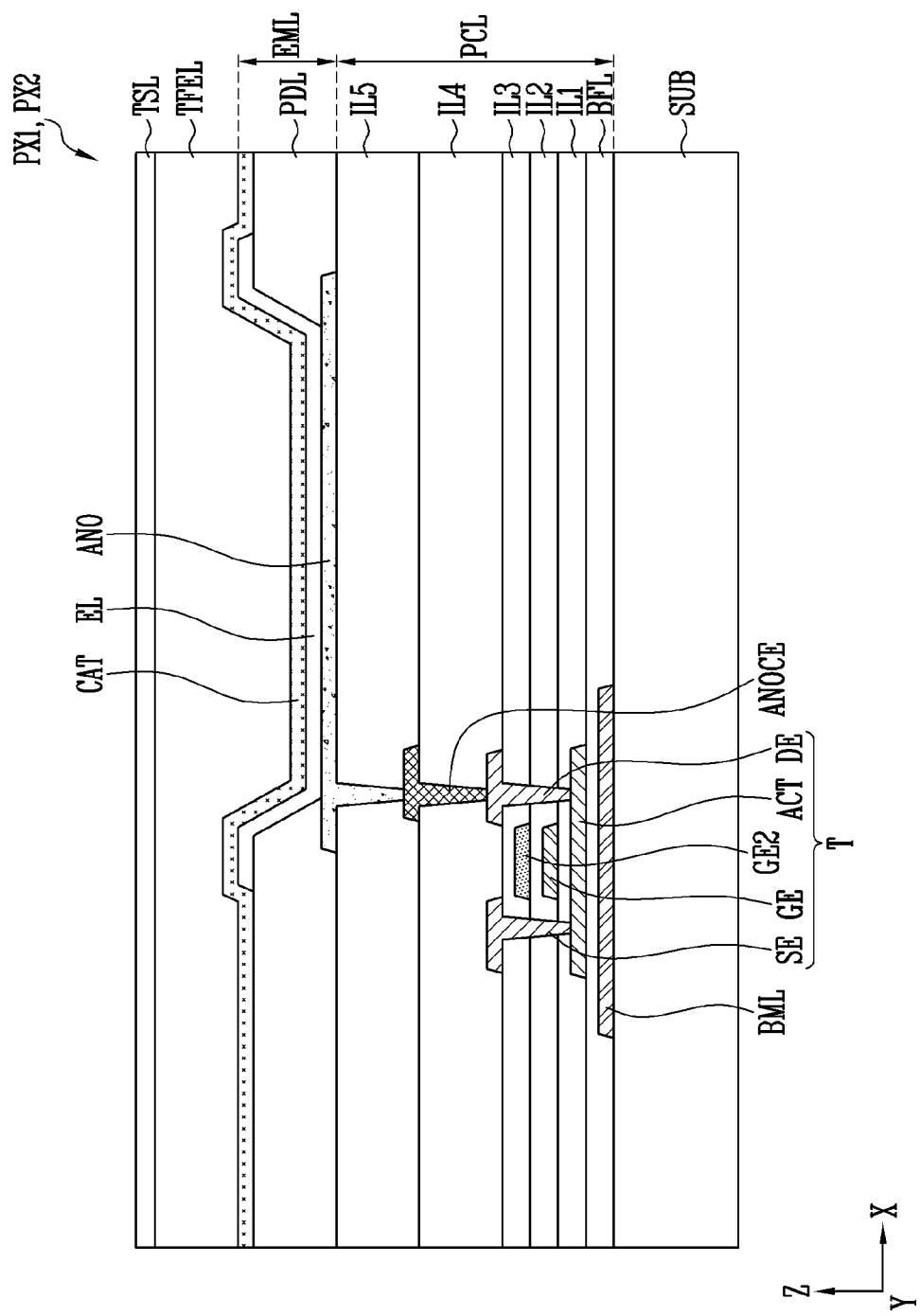
FIG. 16 is a schematic cross-sectional view illustrating a pixel shown in FIG. 14.

FIG. 14 is an enlarged view of a display device in accordance with an embodiment. FIG. 15 is a schematic cross-sectional view taken along line D-D' shown in FIG. 14. FIG. 16 is a schematic cross-sectional view illustrating a pixel shown in FIG. 14.

Referring to FIGS. 14 to 16, the display device in accordance with this embodiment may be different from an embodiment shown in FIGS. 1 to 10, in that the display device may include first signal lines SL1 and DL1 that may drive first pixels PX1 and second signal lines SL2 and DL2 that may drive second pixels PX2.

As an example, the first pixels PX1 and the second pixels PX2 may be electrically connected to a driver respectively through the first signal lines SL1 and DL1 and the second signal lines SL2 and DL2, to be separately driven. However, the driving method of the pixels PX1 and PX2 is not limited thereto. For example, the driver may include a first driver which may drive the first pixels PX1 through the first signal lines SL1 and DL1 and a second driver which may drive the second pixels PX2 through the second signal lines SL2 and DL2.

The first signal lines SL1 and DL1 may include first scan lines SL1 electrically connected to the first pixels PX1 to provide a scan signal and first data lines DL1 electrically connected to the first pixels PX1 to provide a data signal. Each of the first scan lines SL1 may extend along the first direction (X-axis direction), and may be electrically connected to first pixels PX1 disposed on the same pixel row by detouring the transmission part TP. Each of the first data lines DL1 may extend along the second direction (Y-axis direction), and may be electrically connected to first pixels PX1 disposed on the same pixel column by detouring the transmission part TP.

The second signal lines SL2 and DL2 may include second scan lines SL2 electrically connected to the second pixels PX2 to provide a scan signal and second data lines DL2 electrically connected to the second pixels PX2 to provide a data signal. The second scan lines SL2 may extend along the first direction (X-axis direction), and may be electrically connected to the second pixels PX2 by detouring the transmission part TP. The second data lines DL2 may extend along the second direction (Y-axis direction), and may be electrically connected to the second pixels PX2 by detouring the transmission part TP. In a case that the first signal lines SL1 and DL1 and the second signal lines SL2 and DL2 may be respectively electrically connected to the first pixels PX1 and the second pixels PX2 by detouring the transmission part TP, the transmittance of the transmission part TP may be improved, which has been described above.

Referring to FIG. 15, the first signal lines SL1 and DL1, and the second signal lines SL2 and DL2 may be configured or formed with different conductive layers. For example, the first scan line SL1 may be disposed between the first insulating layer IL1 and the second insulating layer IL2, the second scan line SL2 may be disposed between the second insulating layer IL2 and the third insulating layer IL3, the first data line DL1 may be disposed between the third insulating layer IL3 and the fourth insulating layer IL4, and the second data line DL2 may be disposed on the second data line DL2.

A fifth insulating layer IL5 may be disposed over the second data line DL2. The fifth insulating layer IL5 may be a via layer. The fifth insulating layer IL5 may include the same or similar material as the above-described third insulating layer IL3, or include at least one material selected from the materials exemplified as the material constituting the third insulating layer IL3. In a case that the first signal lines SL1 and DL1, and the second signal lines SL2 and DL2 are configured or formed with difference conductive layers, the lines may be prevented from being short-circuited, even in a case that a distance between the lines may be formed narrow since the first signal lines SL1 and DL2 and the second signal lines SL2 and DL2 may detour the transmission part TP.

Referring to FIG. 16, each of the transistors T may include a second gate electrode GE2 disposed on the gate electrode GE. The gate electrode GE may be configured or formed with the same conductive layer as the above-described first scan line SL1, and the second gate electrode GE2 may be configured or formed with the same conductive layer as the above-described second scan line SL2. The second gate electrode GE2 may include the same or similar material as the above-described gate electrode GE, or include at least one material selected from the materials exemplified as the material constituting the gate electrode GE.

The third insulating layer IL3 may be disposed over the second gate electrode GE2, and the source electrode SE and/or the drain electrode DE may be disposed on the third insulating layer IL3. The source electrode SE and/or the drain electrode DE may be configured or formed with the same conductive layer as the above-described first data line DL1. The source electrode SE and the drain electrode DE may be electrically connected to the source region and the drain region of the semiconductor layer ACT through contact holes penetrating the first to third insulating layers IL1, IL2, and IL3, respectively.

The fourth insulating layer IL4 may be disposed over the source electrode SE and/or the drain electrode DE, and the connection electrode ANOCE may be disposed on the fourth insulating layer IL4. The connection electrode ANOCE may be configured or formed with the same conductive layer as the above-described second data line DL2. The connection electrode ANOCE may be electrically connected to the drain electrode DE through a contact hole penetrating the fourth insulating layer IL4.

The fifth insulating layer IL5 may be disposed over the connection electrode ANOCE, and the first electrode ANO of each of the pixels PX1 and PX2 may be disposed on the fifth insulating layer IL5. The first electrode ANO may be electrically connected to the connection electrode ANOCE through a contact hole penetrating the fifth insulating layer IL5.

In accordance with this embodiment, the display device may include the first signal lines SL1 and DL1 that may drive the first pixels PX1 and the second signal lines SL2 and DL2 that may drive the second pixels PX2, and the first signal lines SL1 and DL1 and the second signal lines SL2 and DL2 may be respectively electrically connected to the first pixels PX1 and the second pixels PX2 by detouring the transmission part TP, so that the transmittance of the transmission part TP may be improved.

The scan line load of the second region A2 and the third region A3 may be increased by the load compensation element LM disposed in the side display regions DA1, DA2, DA3, and DA4, and thus the difference between the load value of each of the second region A2 and the third region A3 and the load value of the first region A1 may be minimized. Accordingly, the lowering of resolution of the front display region DA0 as the main display region may be prevented, and simultaneously, the luminance difference in the front display region DA0 due to the transmission region TA may be minimized, which has been described above.

Figure 17:
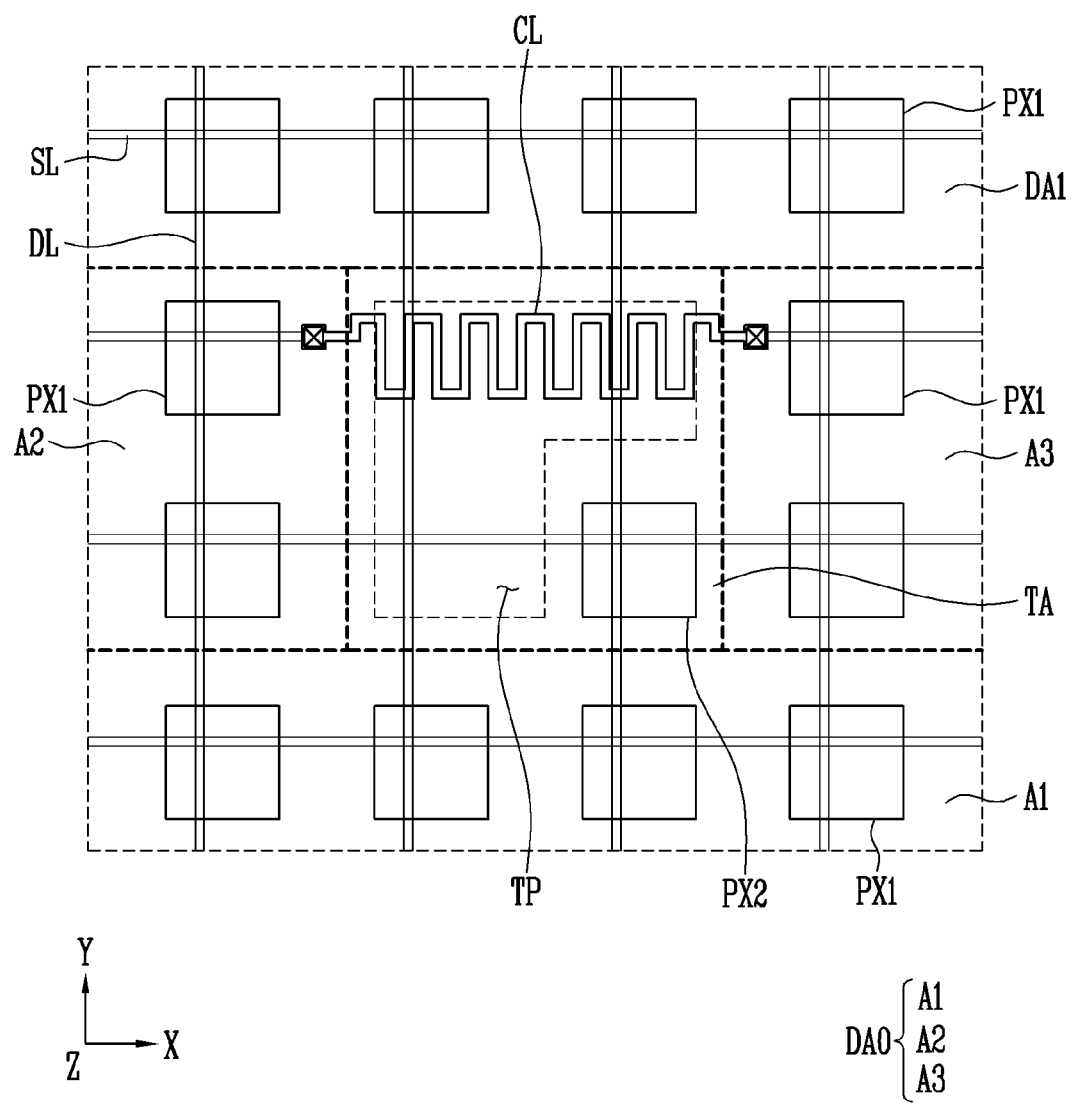
FIGS. 17 and 18 are enlarged views of a display device in accordance with an embodiment.
Figure 18:
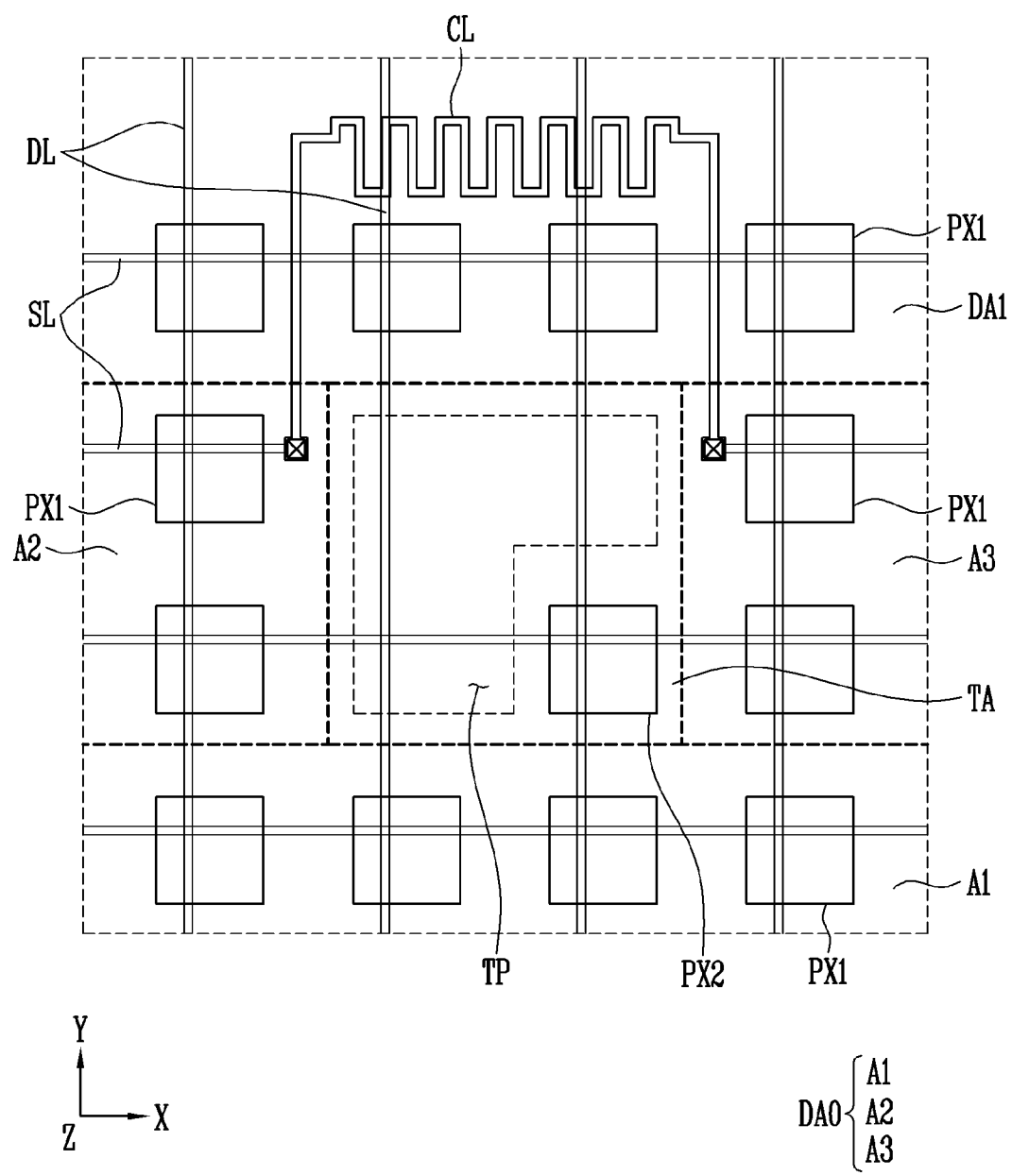

FIGS. 17 and 18 are enlarged views of a display device in accordance with an embodiment.

Referring to FIGS. 17 and 18, the display device in accordance with an embodiment may be different from an embodiment shown in FIGS. 1 to 10, in that a connection line CL may include bent parts.

As an example, the connection line CL may include bent parts. Accordingly, the length of the connection line CL may be increased in a limited space, and thus the connection line CL may have a high resistance value. One end of the connection line CL may be the scan line SL of the second region A2, and the other end of the connection line CL may be electrically connected to the scan line SL in the third region A3. For example, scan line loads of the second region A2 and the third region A3 may be increased by the connection line CL.

Referring to FIG. 17, the connection line CL may be disposed in the transmission region TA. For example, the connection line CL may at least partially overlap the transmission part TP. The connection line CL may be made of a transparent conductive material to provide a path through which light provided from the outside advances toward the sensor device CM in the display device 1. However, the disclosure is not limited thereto. In an embodiment, the connection line CL may not be disposed to overlap the transmission region TA. For example, referring to FIG. 18, the connection line CL may be disposed in the first side display region DA1 by detouring the transmission region TA. In a case that the connection line CL may be electrically connected to the scan line SL by detouring the transmission region TA, the transmittance of the transmission part TP may be improved.

In accordance with an embodiment, the scan line loads of the second region A2 and the third region A3 may be increased by the connection line CL including the bent parts, and thus the difference between the load value of each of the second region A2 and the third region A3 and the load value of the first region A1 may be minimized. Accordingly, the lowering of resolution of the front display region DA0 as the main display region may be prevented, and simultaneously, the luminance difference in the front display region DA0 due to the transmission region TA may be minimized, which has been described above.

Figure 19:
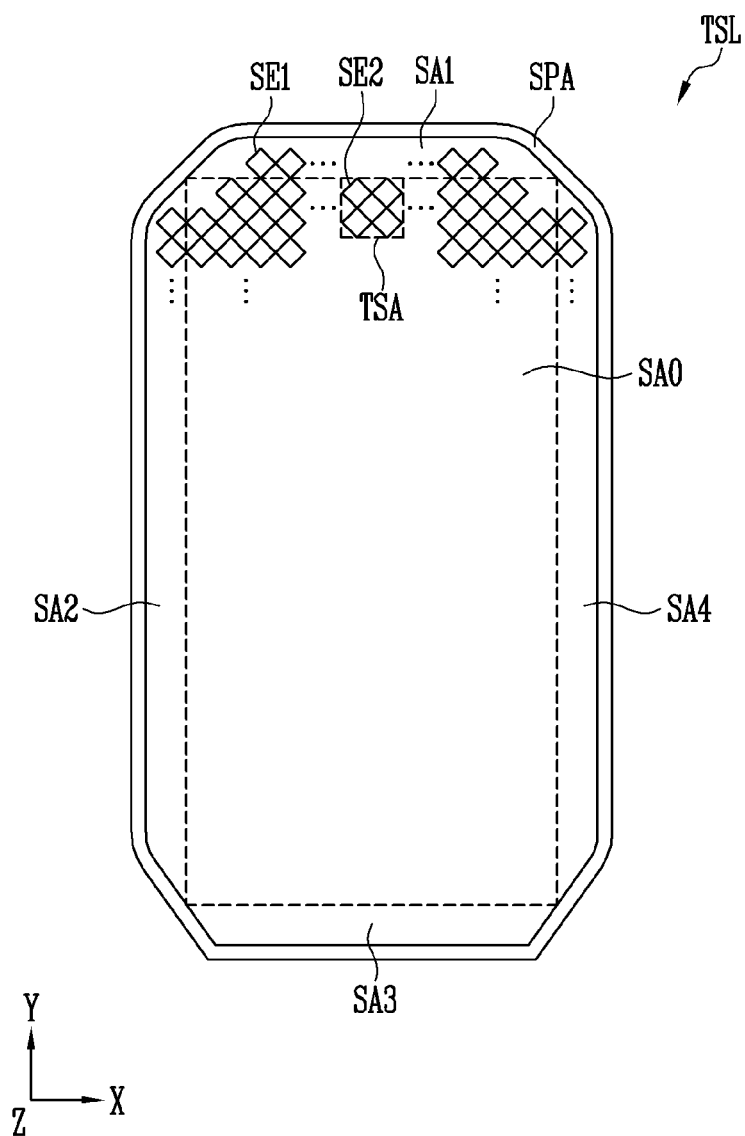
FIG. 19 is a development view illustrating a sensing layer of a display device in accordance with an embodiment.

FIG. 19 is a development view illustrating a sensing layer of a display device in accordance with an embodiment.

Referring to FIG. 19, the sensing layer TSL of the display device in accordance with this embodiment may include a first sensing electrode SE1 disposed in sensing regions SA0, SA1, SA2, SA3, and SA4 and a second sensing electrode SE2 disposed in a transmission sensing region TSA.

As an example, the sensing layer TSL may include the sensing regions SA0, SA1, SA2, SA3, and SA4 that may sense a touch of a user and a sensing peripheral region SPA disposed at the periphery of the sensing regions SA0, SA1, SA2, SA3, and SA4.

The sensing regions SA0, SA1, SA2, SA3, and SA4 may include a front sensing region SA0, and side sensing regions SA1, SA2, SA3, and SA4 extending from the front sensing region SA0.

The front sensing region SA0 may overlap the above-described front display region DA0, and have a substantially planar shape corresponding to that of the front display region DA0. The transmission sensing region TSA may be disposed in the front sensing region SA0. The transmission sensing region TSA may be a region overlapping the above-described transmission region TA, and may be a region overlapping the sensor device CM. The transmission sensing region TSA may have a position and a shape, which may correspond to that of the transmission region TA.

The side sensing regions SA1, SA2, SA3, and SA4 may include a first side sensing region SA1, a second side sensing region SA2, a third side sensing region SA3, and a fourth side sensing region SA4. The first to fourth side sensing regions SA1, SA2, SA3, and SA4 may respectively extend from first to fourth sides of the front sensing region SA0. The first to fourth side sensing regions SA1, SA2, SA3, and SA4 may respectively overlap the above-described first to fourth side display regions DA1, DA2, DA3, and DA4, and may respectively have substantially planar shapes corresponding to those of the first to fourth side display regions SA1, SA2, SA3, and SA4.

The sensing peripheral region SPA may be located or disposed at the periphery of the front sensing region SA0 and the side sensing regions SA1, SA2, SA3, and SA4.

The sensing layer TSL may sense a touch of a user in a self-capacitance manner and/or a mutual capacitance manner. For example, the sensing layer TSL may sense the touch of the user in the mutual capacitance manner in the front sensing region SA0 and the side sensing regions SA1, SA2, SA3, and SA4, and sense the touch of the user in the self-capacitance manner in the transmission sensing region TSA.

For example, the sensing layer TSL may include the first sensing electrode SE1 disposed in the front sensing region SA0 and/or the side sensing regions SA1, SA2, SA3, and SA4. For example, the first sensing electrode SE1 may include a driving electrode and a sensing electrode, and the driving electrode and the sensing electrode may overlap each other in the third direction (Z-axis direction) with a sensing insulating layer interposed therebetween. A mutual capacitance may be formed at an intersection portion at which the driving electrode and the sensing electrode may overlap each other, and the sensing layer TSL may determine whether a touch of a user has occurred by sensing a variation of the mutual capacitance. The first sensing electrode SE1 may include a mesh metal layer, and the mesh metal layer may be disposed to overlap the pixel defining layer PDL defining light emitting regions of the first pixels PX1 arranged or disposed in a matrix form in the display regions DA0, DA1, DA2, DA3, DA4.

The sensing layer TSL may include the second sensing electrode SE2 disposed in the transmission sensing region TSA. The second sensing electrode SE2 may have an electrically independent self-capacitance, and the sensing layer TSL may determine whether a touch of a user has occurred by sensing a change in capacitance due to the touch of the user. The second sensing electrode SE2 may be configured or formed with a transparent conductive layer, or include a mesh metal layer. In a case that the second sensing electrode SE2 may include the mesh metal layer, the mesh metal layer may be disposed to overlap the pixel defining layer PDL defining light emitting regions of the second pixels PX2 disposed in the transmission region TA. The second pixels PX2 cannot be arranged or disposed in the matrix form of the first pixels PX1 due to the transmission part TP, and therefore, the arrangement and shape of the second sensing electrode SE2 may be different from those of the first sensing electrode SE1.

Meanwhile, although a case where the sensing layer TSL senses the touch of the user in the mutual capacitance manner in the front sensing region SA0 and the side sensing regions SA1, SA2, SA3, and SA4, and senses the touch of the user in the self-capacitance manner in the transmission sensing region TSA has been exemplified in FIG. 19, the disclosure is not limited thereto.

Figure 20:
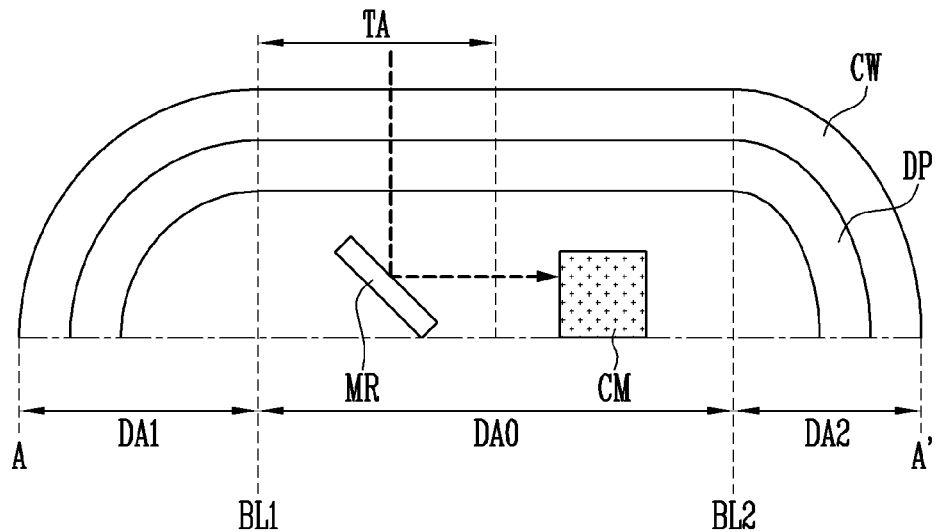
FIGS. 20 and 21 are schematic cross-sectional views of a display device in accordance with an embodiment.
Figure 21:
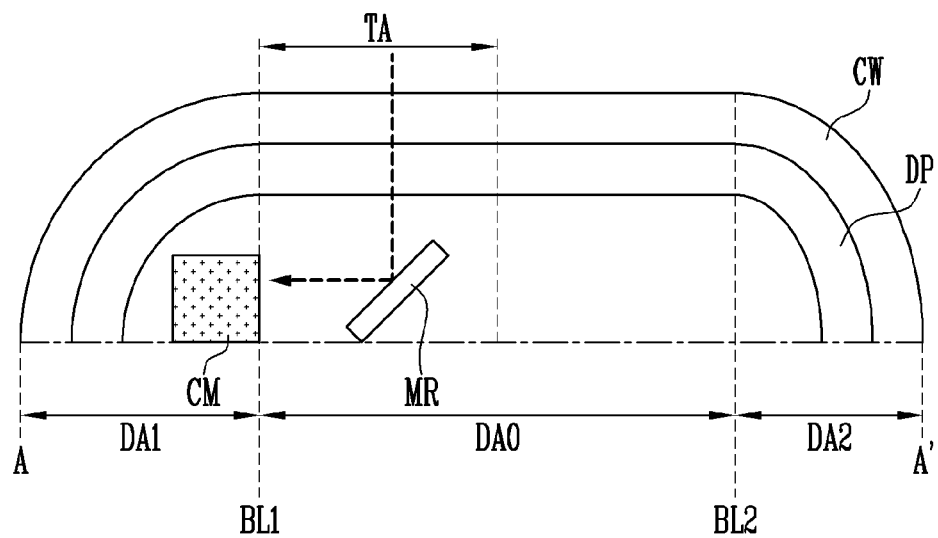

FIGS. 20 and 21 are schematic cross-sectional views of a display device in accordance with an embodiment, which illustrate a section corresponding to the line A-A' shown in FIG. 1.

Referring to FIGS. 20 and 21, the display device in accordance with this embodiment may be different from an embodiment shown in FIGS. 1 to 10, in that the display device may include a reflective member MR disposed in the transmission region TA.

As an example, the reflective member MR may reflect light provided from the transmission region TA and transfer the reflected light to the sensor device CM. To this end, the reflective member MR may be disposed to at least partially overlap the transmission region TA in the third direction (Z-axis direction). Since the light provided from the transmission region TA may be provided to the sensor device CM by the reflective member MR, the sensor device CM may be disposed regardless of whether the sensor device CM overlaps with the transmission region TA. For example, as shown in FIG. 20, the sensor device CM may be disposed in the front display region DA0 except the transmission region TA. Also, as shown in FIG. 21, the sensor device CM may be disposed in the first side display region DA1. As described above, in a case that the sensor device CM may be disposed to not overlap the transmission region TA, external light may be prevented from being reflected by a lens, for example, of the sensor device CM and then again viewed in the transmission region TA.

Figure 22:
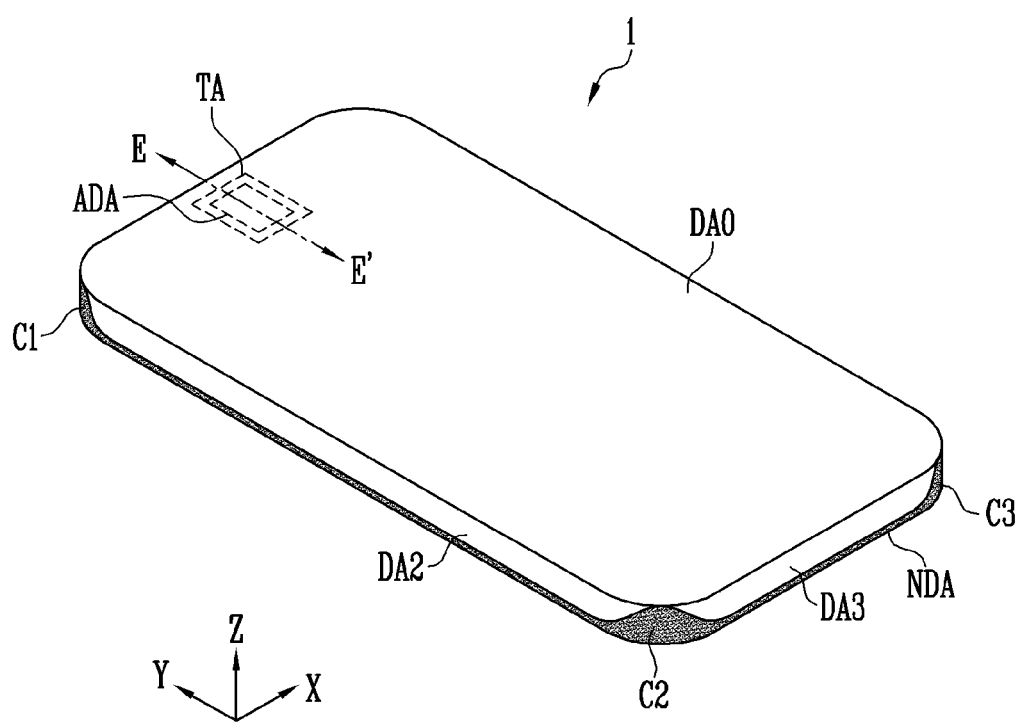
FIG. 22 is a perspective view of a display device in accordance with an embodiment.
Figure 23:
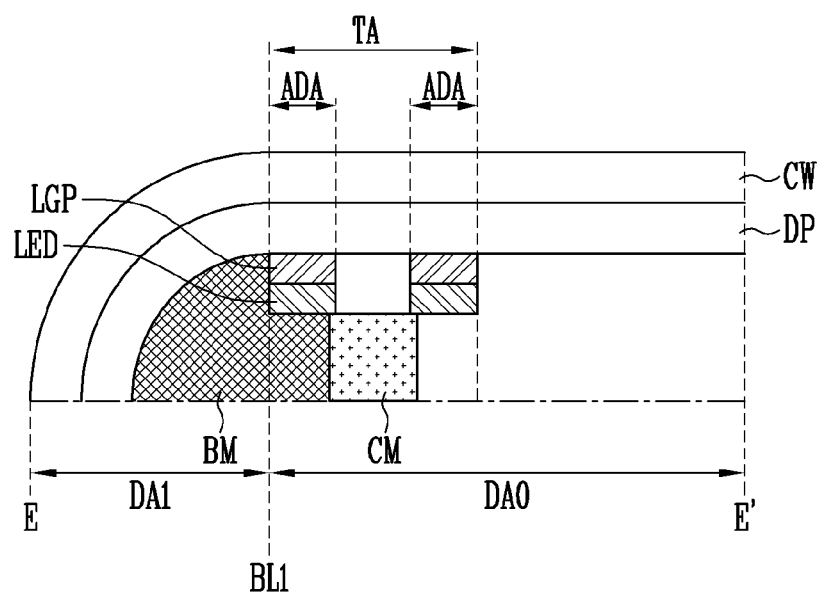
FIG. 23 is a schematic cross-sectional view taken along line E-E' shown in FIG. 22.

FIG. 22 is a perspective view of a display device in accordance with an embodiment. FIG. 23 is a schematic cross-sectional view taken along line E-E' shown in FIG. 22.

Referring to FIGS. 22 and 23, the display device in accordance with this embodiment may be different from an embodiment shown in FIGS. 1 to 10, in that the transmission region TA may include an auxiliary light emitting region ADA.

As an example, the auxiliary light emitting region ADA may be disposed in the transmission region TA. The auxiliary light emitting region ADA may be disposed along an edge of the sensor device CM, and include an opening region exposing a top surface of the sensor device CM. The auxiliary light emitting region ADA may have a light emitting device separately from the display panel DP, to compensate for a luminance of the transmission region TA. The auxiliary light emitting region ADA may at least partially overlap the edge of the sensor device CM in the third direction (Z-axis direction), but the disclosure is not limited thereto.

An auxiliary light emitting device LED and/or a light guide member LGP may be disposed in the auxiliary light emitting region ADA. The auxiliary light emitting device LED and the light guide member LGP may be disposed between the sensor device CM and the display panel DP on a section.

The auxiliary light emitting device LED may be disposed on the top of the sensor device CM. The auxiliary light emitting device LED may be a micro LED having an approximate size of a micrometer (μm). For example, the length of one side of the auxiliary light emitting device LED may be about 100 μm or less, but the disclosure is not limited thereto. The auxiliary light emitting device LED may be disposed along the edge of the sensor device CM in the transmission region TA, to compensate for the luminance of the transmission region TA.

The light guide member LGP may be disposed between the light emitting device LED and the display panel DP on a section. The light guide member LGP may display an image in the auxiliary light emitting region ADA by guiding light emitted from the auxiliary light emitting device LED. Meanwhile, although a case where a space surrounded by or adjacent to the auxiliary light emitting device LED, the light guide member LGP, the sensor device CM, and/or the display panel DP is empty has been exemplified in FIG. 23, the disclosure is not limited thereto. For example, an optically clear adhesive film (OCA) or an optically clear resin (OCR) may be disposed in the space.

In an embodiment, a light blocking part BM may be disposed between the first side display region DA1 and the auxiliary light emitting region ADA. The light blocking part BM may include an opaque material such as black pigment. The light blocking part BM may prevent light emitted from the auxiliary light emitting device LED from being viewed in the first side display region DA1.

In accordance with the disclosure, the display device may include the load compensation element disposed in the side display region, and the pixels of the second region and the third region may be electrically connected to the load compensation element by the connection line which may detour the transmission region.

Accordingly, although the pixel rows of the second region and the third region have a relatively small number of pixels due to the transmission region, the scan line loads of the second region and the third region may be increased by the load compensation element.

For example, the difference between the load value of each of the second region and the third region and the load value of the first region may be minimized. Accordingly, the lowering of resolution of the front display region as the main display region may be prevented, and simultaneously, the luminance difference in the front display region due to the transmission region may be minimized.

While the disclosure has been described in connection with the embodiments, it will be understood by those skilled in the art that various modifications and changes may be made thereto without departing from the spirit and scope of the disclosure defined by the appended claims.

Thus, the scope of the disclosure should not be limited by the embodiments described herein but may be defined by the appended claims and equivalents thereof.

What is claimed is:

1. A display device comprising:
a display panel including a substrate including:
a front display region;
a side display region extending from a side of the front display region at a bending line that forms a curved surface; and
a transmission region including at least a portion overlapping the front display region in a plan view; and
a sensor located on a bottom of the substrate, the sensor having at least a portion overlapping the transmission region in a plan view,
wherein the display panel includes:
first pixels disposed in the front display region;
third pixels and a load compensation element disposed in the side display region; and
a connection line electrically connecting the first pixels and the load compensation element by detouring the transmission region.

2. The display device of claim 1, wherein
the front display region includes a first region, a second region, and a third region, the first region, the second region, and the third region having different areas, and
the connection line electrically connects first pixels disposed in the second region and first pixels disposed in the third region by detouring the transmission region.

3. The display device of claim 2, wherein an area of the first region is greater than an area of the second region and an area of the third region.

4. The display device of claim 2, wherein the load compensation element compensates for a difference between a load value of the second region and the third region and a load value of the first region.

5. The display device of claim 2, wherein the first pixels of the second region, that are electrically connected to a side of the connection line, and the first pixels of the third region, that are electrically connected to another side of the connection line, are disposed on a same pixel row.

6. The display device of claim 5, wherein the load compensation element is a dummy pixel that does not emit light.

7. The display device of claim 5, wherein the connection line includes bent parts.

8. The display device of claim 5, wherein the side display region includes:
   a first side display region extending from a first side of the front display region; and
   a second side display region extending from a second side of the front display region, wherein
   the display panel includes a corner region disposed between the first side display region and the second side display region.

9. A display device comprising:
   a display panel including a substrate including:
      a front display region;
      a side display region extending from a side of the front display region; and
      a transmission region including at least a portion overlapping the front display region in a plan view; and
   a sensor located on a bottom of the substrate, the sensor having at least a portion overlapping the transmission region in a plan view,
   wherein the display panel includes:
      first pixels disposed in the front display region;
      a load compensation element disposed in the side display region, the load compensation element including a first conductive layer, a semiconductor layer, and a second conductive layer that are stacked; and
      a connection line electrically connecting the first pixels and the load compensation element by detouring the transmission region, wherein
   the first conductive layer and the second conductive layer are electrically connected to each other to form a first capacitor electrode of the load compensation element, and
   the semiconductor layer forms a second capacitor electrode of the load compensation element.

10. The display device of claim 9, wherein the connection line is formed of a same conductive layer as the first conductive layer.

11. A display device comprising:
   a display panel including a substrate including:
      a front display region;
      a side display region extending from a side of the front display region; and
      a transmission region including at least a portion overlapping the front display region in a plan view; and
   a sensor located on a bottom of the substrate, the sensor having at least a portion overlapping the transmission region in a plan view,
   wherein the display panel includes:
      first pixels disposed in the front display region,
      a load compensation element disposed in the side display region; and
   a connection line electrically connecting the first pixels and the load compensation element by detouring the transmission region, wherein
   the display panel includes:
      a substrate;
      a circuit element layer disposed on the substrate, the circuit element layer including transistors;
      a first electrode electrically connected to the transistors;
      a second electrode disposed on the first electrode; and
      a light emitting layer disposed between the first electrode and the second electrode, wherein
   the load compensation element is a dummy pixel that does not emit light, and
   at least one of the first electrode, the second electrode, and the light emitting layer does not overlap the dummy pixel.

12. A display device comprising:
   a display panel including a substrate including:
      a front display region,
      a side display region extending from a side of the front display region; and
      a transmission region including at least a portion overlapping the front display region in a plan view; and
   a sensor located on a bottom of the substrate, the sensor having at least a portion overlapping the transmission region in a plan view,
   wherein the display panel includes:
      first pixels disposed in the front display region;
      a load compensation element disposed in the side display region; and
   a connection line electrically connecting the first pixels and the load compensation element by detouring the transmission region, wherein
   the display panel includes second pixels disposed in the transmission region.

13. The display device of claim 12, wherein a number of first pixels per unit area is greater than a number of second pixels per unit area.

14. The display device of claim 12, wherein
   the transmission region includes a transmission part not overlapping the second pixels, and
   the sensor overlaps the transmission part.

15. The display device of claim 14, wherein the second pixels are adjacent to the transmission part.

16. The display device of claim 14, wherein the sensor is a camera and receives light from the transmission part while overlapping the transmission part.

17. The display device of claim 16, further comprising:
   a reflective member that reflects light from the transmission part and transfers the reflected light to the sensor.

18. The display device of claim 14, wherein the display panel includes a first signal line electrically connected to the first pixels disposed on a same pixel row or a same pixel column by detouring the transmission part.

19. The display device of claim 18, wherein the first signal line and the connection line are formed of different conductive layers.

20. The display device of claim 18, wherein
   the display panel includes a second signal line electrically connected to the second pixels by detouring the transmission part, and
   the second signal line and the first signal line are formed with different conductive lines.

* * * * *